United States Patent
Fujioka

(10) Patent No.: US 9,147,441 B2
(45) Date of Patent: Sep. 29, 2015

(54) SEMICONDUCTOR MEMORY DEVICE AND ELECTRONIC DEVICE

(71) Applicant: FUJITSU SEMICONDUCTOR LIMITED, Yokohama-shi, Kanagawa (JP)

(72) Inventor: Shinya Fujioka, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 139 days.

(21) Appl. No.: 13/973,490

(22) Filed: Aug. 22, 2013

(65) Prior Publication Data

US 2014/0085960 A1 Mar. 27, 2014

(30) Foreign Application Priority Data

Sep. 26, 2012 (JP) ................................ 2012-212449

(51) Int. Cl.
G11C 5/06 (2006.01)
G11C 8/12 (2006.01)
G11C 11/413 (2006.01)
G11C 7/20 (2006.01)

(52) U.S. Cl.
CPC .. *G11C 5/06* (2013.01); *G11C 8/12* (2013.01); *G11C 11/413* (2013.01); *G11C 7/20* (2013.01)

(58) Field of Classification Search
CPC ........... G11C 5/06; G11C 8/12; G11C 11/413
USPC ............. 365/63, 189.08, 230.03, 231, 189.03
See application file for complete search history.

(56) References Cited

U.S. PATENT DOCUMENTS

| | | | | |
|---|---|---|---|---|
| 5,313,431 A | * | 5/1994 | Uruma et al. | 365/205 |
| 5,398,210 A | | 3/1995 | Higuchi | |
| 5,828,623 A | * | 10/1998 | Dilbeck | 365/230.05 |
| 5,875,470 A | * | 2/1999 | Dreibelbis et al. | 711/147 |
| 5,978,307 A | * | 11/1999 | Proebsting et al. | 365/230.05 |
| 6,104,641 A | | 8/2000 | Itou | |
| 7,016,255 B2 | * | 3/2006 | Lee et al. | 365/230.05 |
| 7,251,249 B2 | * | 7/2007 | Nanduri et al. | 370/429 |
| 7,394,717 B2 | * | 7/2008 | Hidaka | 365/230.03 |
| 8,429,319 B2 | * | 4/2013 | Do | 710/71 |
| 8,688,877 B1 | * | 4/2014 | Lee et al. | 710/71 |
| 2002/0031039 A1 | | 3/2002 | Suzuki | |
| 2007/0150668 A1 | * | 6/2007 | Kwon et al. | 711/149 |

FOREIGN PATENT DOCUMENTS

| | | |
|---|---|---|
| JP | 06-332797 A | 12/1994 |
| JP | 2000-030457 A | 1/2000 |
| JP | 2000-040375 A | 2/2000 |
| JP | 2004-118915 A | 4/2004 |
| KR | 10-2007-0066400 A | 6/2007 |

OTHER PUBLICATIONS

Korean Office Action, dated Aug. 28, 2014, issued in corresponding Korean Patent Application No. 10-2013-0113843.

* cited by examiner

*Primary Examiner* — Viet Q Nguyen
(74) *Attorney, Agent, or Firm* — Arent Fox LLP

(57) ABSTRACT

A semiconductor memory device including a plurality of memory blocks MBA0, MBA1, MBB0, MBB1; a plurality of bus lines 26 provided respectively associated with the plurality of memory blocks; a plurality of input/output ports 22a, 22b; a selector 28a, 28b selectively connecting each of the plurality of bus lines to one of the plurality of input/output ports; and a setting unit 38a, 38b setting a connection of the selector.

6 Claims, 24 Drawing Sheets

FIG. 12

|  | MEMORY BLOCK | P0 | P1 | P2 |
|---|---|---|---|---|
| SETTING A-I | A0 | L | L | L |
| SETTING A-II | A0+A1 | H | L | L |
| SETTING A-III | A0+A1+B1 | L | H | L |
| SETTING A-IV | A0+A1+B0+B1 | H | H | L |

|  | MEMORY BLOCK | Q0 | Q1 | Q2 |
|---|---|---|---|---|
| SETTING B-I | B0 | L | L | L |
| SETTING B-II | B0+B1 | H | L | L |
| SETTING B-III | B0+B1+A1 | L | H | L |
| SETTING B-IV | B0+B1+A0+A1 | H | H | L |

FIG. 24

| | MEMORY BLOCK | P0 | P1 | P2 | ha0 | ha1 | ha2 |
|---|---|---|---|---|---|---|---|
| SETTING A-I | A0 | L | L | L | DISCONNECT | DISCONNECT | DISCONNECT |
| SETTING A-II | A0+A1 | H | L | L | CONNECT | DISCONNECT | DISCONNECT |
| SETTING A-III | A0+A1+B1 | L | H | L | DISCONNECT | CONNECT | DISCONNECT |
| SETTING A-IV | A0+A1+B0+B1 | H | H | L | CONNECT | CONNECT | DISCONNECT |

| | MEMORY BLOCK | Q0 | Q1 | Q2 | hb0 | hb1 | hb2 |
|---|---|---|---|---|---|---|---|
| SETTING B-I | B0 | L | L | L | DISCONNECT | DISCONNECT | DISCONNECT |
| SETTING B-II | B0+B1 | H | L | L | CONNECT | DISCONNECT | DISCONNECT |
| SETTING B-III | B0+B1+A1 | L | H | L | DISCONNECT | CONNECT | DISCONNECT |
| SETTING B-IV | B0+B1+A0+A1 | H | H | L | CONNECT | CONNECT | DISCONNECT |

SEMICONDUCTOR MEMORY DEVICE AND ELECTRONIC DEVICE

CROSS-REFERENCE TO RELATED APPLICATION

This application is based upon and claims the benefit of priority of the prior Japanese Patent Application No. 2012-212449, filed on Sep. 26, 2012, the entire contents of which are incorporated herein by reference.

FIELD

The embodiments discussed herein are related to a semiconductor memory device and an electronic device.

BACKGROUND

Recently, an electronic device, e.g., a CPU (Central Processing Unit) and a GPU (Graphics Processing Unit) are mounted on is proposed.

In such electronic device, a plurality of memory devices of the same specifications are mounted, one of the plurality of memory devices is used for, e.g., the CPU and the other of the plurality of memory devices is used for, e.g., the GPU.

Related references are as follows:
Japanese Laid-open Patent Publication No. 2000-40375;
Japanese Laid-open Patent Publication No. Hei 6-332797;
Japanese Laid-open Patent Publication No. 2000-30457; and
Japanese Laid-open Patent Publication No. 2004-118915.

SUMMARY

According to one aspect of an embodiment, a semiconductor memory device including a plurality of memory blocks; a plurality of bus lines provided respectively associated with the plurality of memory blocks; a plurality of input/output ports; a selector selectively connecting each of the plurality of bus lines to either of the plurality of input/output ports; and a setting unit setting a connection of the selector.

According to another aspect of the embodiment, an electronic device including a semiconductor memory device including a plurality of memory blocks; a plurality of bus lines provided respectively associated with the plurality of memory blocks; a plurality of input/output ports; a selector selectively connecting each of the plurality of bus lines to either of the plurality of input/output ports; and a setting unit setting a connection of the selector; and a plurality of processing units, the selector being so set that the memory block which is accessed from one of the plurality of processing unit, and the memory block which is accessed from the other of the plurality of processing units are different from each other.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 12 is setting tables of the semiconductor memory device according to the first embodiment;
FIG. 24 is setting tables of the semiconductor memory device according to the fourth embodiment.

DESCRIPTION OF EMBODIMENTS

Such electronic device is not always sufficiently inexpensive, and the cost reduction is required.

As described above, in the proposed electronic device, a plurality of memory devices of the same specifications are used, one of the plurality of memory devices is used for, e.g., the CPU, and the other of the plurality of memory devices is used for, e.g., the GPU.

For example, when the memory capacity the CPU requires is 96 Mbits, and the memory capacity the GPU requires is 32 Mbits, 2 memories of 96 Mbits are used to satisfy the larger memory capacity.

In the proposed electronic device, although the total memory capacities the CPU and the GPU require is, e.g., 128 Mbits, memories for 192 Mbits are mounted, which makes the electronic device expensive.

[a] First Embodiment

Figure 1:
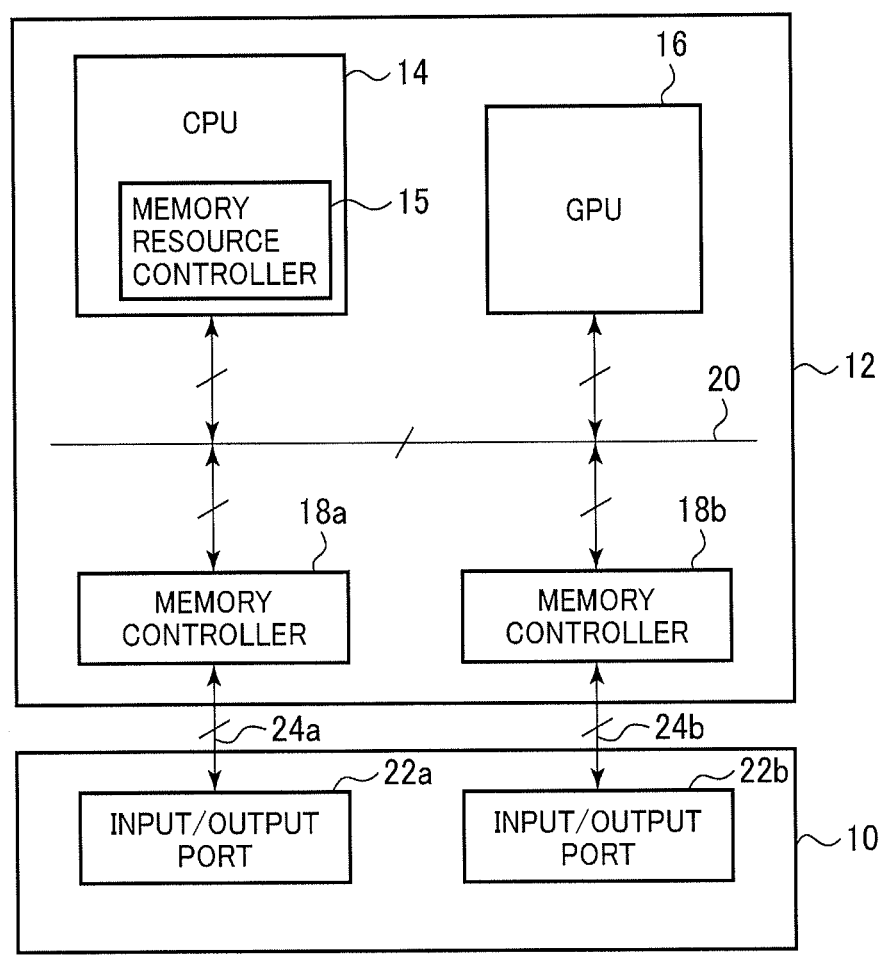
FIG. 1 is a block diagram of an electronic device according to a first embodiment.

The semiconductor memory device and the electronic device according to a first embodiment will be described with reference to FIGS. 1 to 14. FIG. 1 is the block diagram of the electronic device according to the first embodiment.

As illustrated in FIG. 1, the electronic device according to the present embodiment includes, e.g., the semiconductor memory device 10 and an SOC (System On Chip) 12.

In the SOC, a series of functions (systems) is integrated on one semiconductor chip.

In the SOC 12, e.g., a CPU 14, a GPU 16 and memory controllers 18a, 18b are provided.

In the SOC 12, a nonvolatile semiconductor memory device (not illustrated) is mounted. In the nonvolatile semiconductor memory device, programs for operating the electronic device according to the present embodiment are stored.

The memory controllers 18a, 18b are for controlling the semiconductor memory device 10. A plurality of the memory controllers 18a, 18b are provided. Two memory controllers 18a, 18b, for example, are provided here. The memory controller 18a is the memory controller for, e.g., Channel A (channel A side). The memory controller 18b is the memory controller for, e.g., Channel B (channel B side).

The CPU (processing unit) 14, the GPU (processing unit) 16 and the memory controllers 18a, 18b are interconnected with each other by a bus line (system bus) 20.

In the CPU 14, a memory resource controller 15 is provided. As will be described later, in the memory resource controller 15, the information of the resources of memories the GPU 16 requires is registered.

In the semiconductor memory device 10, a plurality of input/output ports (peripheral interfaces, input/output interfaces) 22a, 22b are provided. Two input/output ports 22a, 22b, for example, are provided here. The input/output port 22a is the input/output port for Channel A (channel A side). The input/output port 22b is the input/output port for Channel B (channel B side). The input/output port 22a for channel A and the memory controller 18a for Channel A are interconnected by a bus line 24a. The input/output port 22b for Channel B and the memory controller 18b for Channel B are interconnected by a bus line 24b.

In FIG. 1, those of the constituent members of the semiconductor memory device 10 except the input/output ports 22a, 22b are not illustrated.

Figure 2:
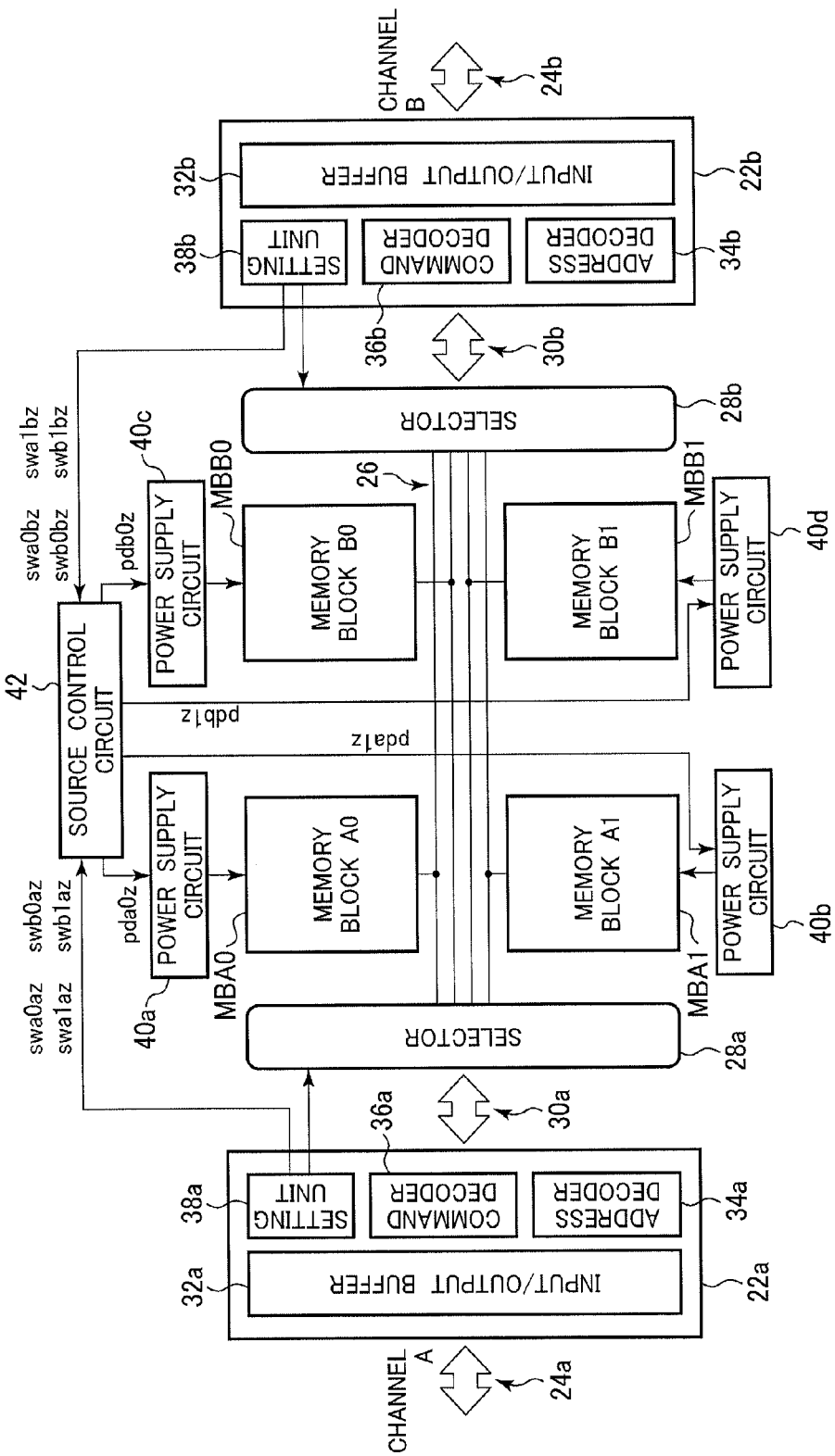
FIG. 2 is a block diagram of a semiconductor memory device according to the first embodiment.

FIG. 2 is the block diagram of the semiconductor memory device according to the present embodiment.

As illustrated in FIG. 2, in the semiconductor memory device 10, a plurality of memory blocks (memory arrays), i.e., a memory block A0 (MBA0), a memory block A1 (MBA1), a memory block B0 (MBB0) and a memory block B1 (MBB1) are provided. The capacities of each memory blocks A0-B1 are, e.g., 32 Mbits.

For the respective memory blocks A0-B1, bus lines 26 are provided.

Between the input/output ports 22a, 22b and the memory blocks A0-B1, selectors (switches) 28a, 28b are respectively provided. The selector 28a provided between the input/output 22a for Channel A and the memory blocks A0-B1 is the selector for Channel A. The selector 28b provided between the input/output port 22b for Channel B and the memory blocks A0-B1 is for the selector for Channel B. The selectors 28a, 28b is for setting each of the memory blocks A0-B1 are to be used with either channel.

The selector 28a for Channel A and the input/output port 22a for Channel A are connected by a bus line 30a. The selector 28b for Channel B and the input/output port 22b for Channel B are connected by a bus line 30b.

In the input/output port 22a for Channel A, an input/output buffer 32a, an address decoder 34a, a command decoder 36a and a setting unit (setting circuit) 38a are provided. As will be described later, the setting unit 38a so sets the selector 28a that a desired memory block A0-B1 is used selectively as Channel A. As the setting unit 38a, a mode register, for example, is used. The mode register is a register which is capable of retaining various operation modes.

The mode register is called also a mode register set (MRS).

In the input/output port 22b for Channel B, an input/output buffer 32b, an address decoder 34b, command decoder 36b and a setting unit (setting circuit) 38b are provided. As will be described later, the setting unit 38b so set the selector 28b that a desired memory block A0-B1 is used selectively as Channel B. As the setting unit 38b, a mode register, for example, is used.

In the memory blocks A0-B1, power supply circuits 40a-40d are respectively provided. The power supply circuit 40a-40d supplies power sources respectively to the memory blocks A0-B1.

A power supply control circuit (power supply control unit) 42 for controlling the power supply circuits 40a-40d is provided.

Figure 3:
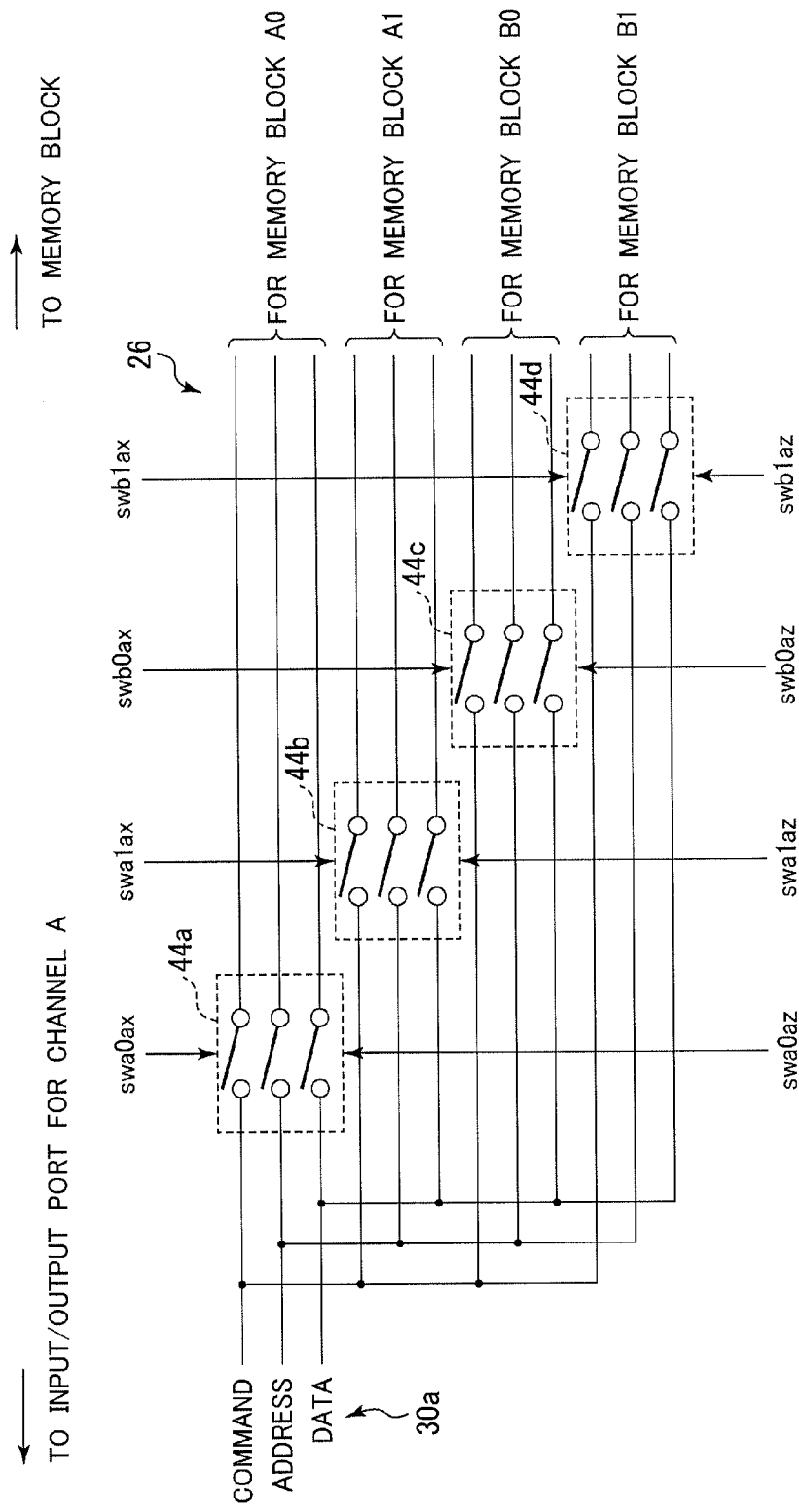
FIG. 3 is a circuit diagram conceptually illustrating a constitution of a selector for Channel A of the semiconductor memory device according to the first embodiment.

FIG. 3 is the circuit diagram conceptually illustrating the constitution of the selector 28a for Channel A. The left side as viewed in FIG. 3 is to be connected to the input/output port 22a, and the right side as viewed in FIG. 3 is to be connected to the memory blocks A0-B1.

The selector 28a for Channel A sets the connection between the bus line 30a to be connected to the input/output port 22a for Channel A and the bus lines 26 respectively provided for the memory blocks A0-B1.

The bus line 30a includes a command bus line (control bus line), an address bus line and a data bus line. In the case that the information of the commands is represented by, e.g., several bits, several command bus lines, for example, are provided. In the case that the information of addresses is represented by, e.g., 16 bits, 16 address bus lines, for example, are provided. In the case that the information of data is represented by, e.g., 16 bits, 16 data bus lines, for example, are provided.

The numbers of the command bus lines, the address bus lines and the data bus lines are not limited to the above and can be suitably set.

In the selector 28a, a plurality of switches 44a-44d are provided. A switch 44a-44d is set to thereby set the connections between the bus lines 30a and the bus lines 26.

When the switch 44a is set ON, the bus line 30a of Channel A is connected to the bus line 26 provided for the memory block A, and the memory block A0 is for Channel A.

On the other hand, when the switch 44a is set OFF, the bus line 30a of Channel A is disconnected to the bus lines 26 provided for the memory block A0, and the memory block A0 is not used in Channel A.

When the switch 44b is set ON, the bus line 30a of Channel A is connected to the bus line 26 provided for the memory block A1, and the memory block A1 is for Channel A.

On the other hand, when the switch 44b is set OFF, the bus line 30a of Channel A is disconnected to the bus line 26 provided for the memory block A1, and the memory block A1 is not used in Channel A.

When the switch 44c is set ON, the bus line 30a of Channel A is connected to the bus line 26 provided for the memory block B0, and the memory block B is for Channel A.

On the other hand, when the switch 44c is set OFF, the bus line 30a for Channel A is disconnected to the bus line 26 provided for the memory B0, and the memory block B0 is not used in Channel A.

When the switch 44d is set ON, the bus line 30a of Channel A is connected to the bus line 26 provided for the memory block B1, and the memory block B1 is for Channel A.

On the other hand, when the switch 44d is set OFF, the bus line 30a of Channel A is disconnected to the bus line 26 provided for the memory block B1, and the memory block B1 is not used in Channel A.

Figure 4:
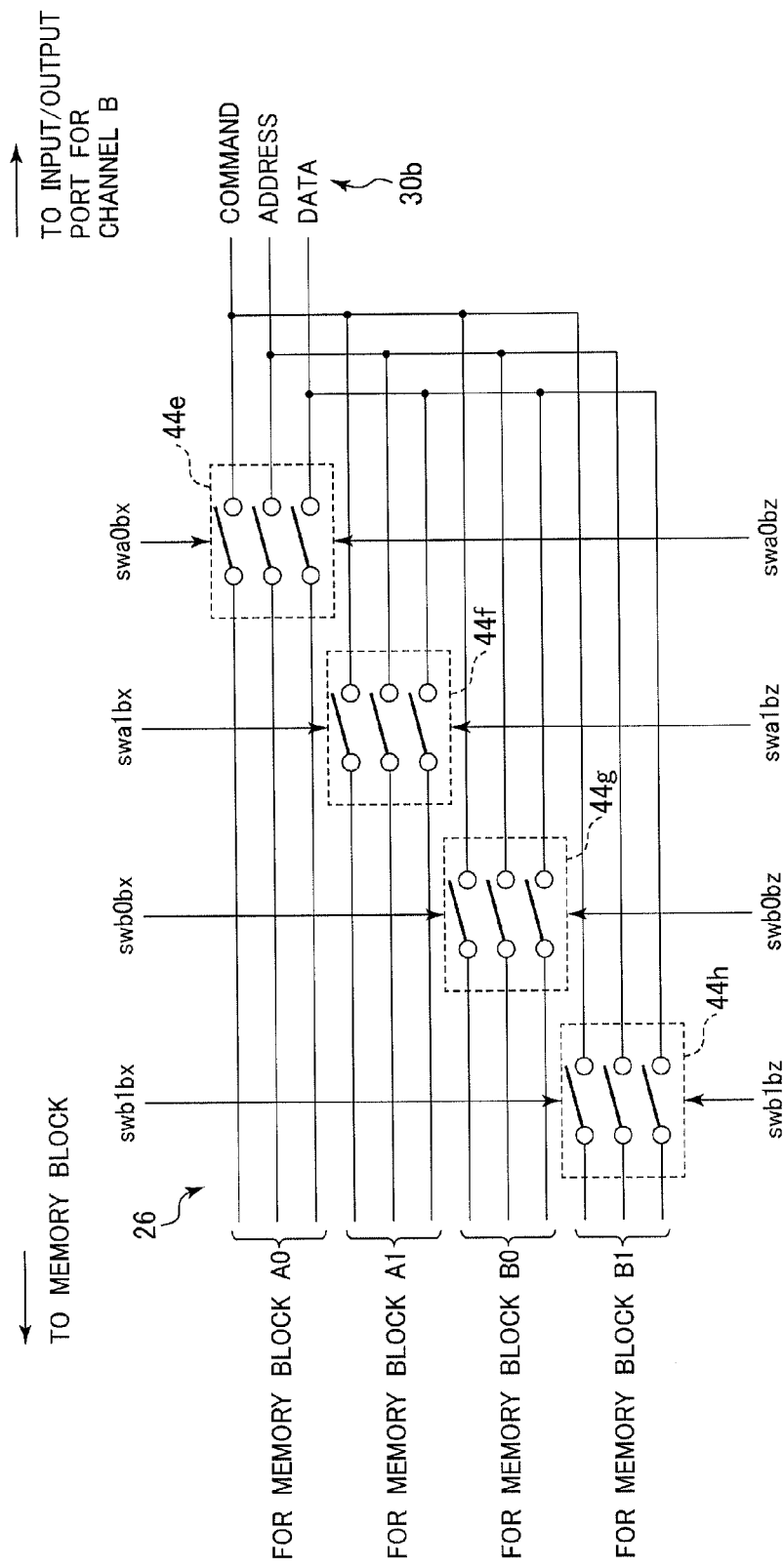
FIG. 4 is a circuit diagram conceptually illustrating a constitution of a selector for Channel B of the semiconductor memory device according to the first embodiment.

FIG. 4 is the circuit diagram which conceptually illustrates the constitution of the selector 28b for Channel B. The right side as viewed in FIG. 4 is to be connected to the input/output port 22b, and the left side as viewed in FIG. 4 is to be connected to the memory blocks A0-B1.

The selector 28b for Channel B is for setting the connection between the bus line 30b to be connected to the input/output port 22b for Channel B and the bus lines 26 respectively provided for the memory blocks A0-B1.

The bus lines 30b includes a command bus line (control bus line), an address bus line and a data bus line, as does the bus line 30a. In the case that the information of command is represented by, e.g., several bits, the several command lines, for examples, are provided. In the case that the information of addresses is represented by, e.g., 16 bits, 16 address bus lines, for example, are provided. In the case that the information of data is represented by, e.g. 16 bits, 16 data bus lines are provided.

As described above, the numbers of the command bus line, the address bus line and the data bus line are not limited to the above and can be suitably set.

In the selector 28b, a plurality of switches 44e-44h are provided. A switch 44e-44h is set to thereby set the connection between the bus line 30b and the bus line 26.

When the switch 44e is set ON, the bus line 30b of Channel B is connected to the bus line 26 provided for the memory block A0, and the memory block A0 is for Channel B.

On the other hand, when the switch 44e is set OFF, the bus line 30b of Channel B is disconnected to the bus line 26 provided for the memory block A0, and the memory block A0 is not used in Channel B.

When the switch 44f is set ON, the bus line 30b of Channel B is disconnected to the bus line 26 provided for the memory block A1, and the memory block A1 is for Channel B.

On the other hand, when the switch 44f is set OFF, the bus line 30b of Channel B is disconnected to the bus line 26 provided for the memory block A1, and the memory block A1 is not used in Channel B.

When the switch 44g is set ON, the bus line 30b of Channel B is connected to the bus line 26 provided for the memory block B0, and the memory block B0 is for Channel B.

On the other hand, when the switch 44g is set OFF, the bus line 30b of Channel B is disconnected to the bus line 26 provided for the memory block B0, and the memory block B0 is not used for Channel B.

When the switch 44h is set ON, the bus line 30b of Channel B is connected to the bus line 26 provided for the memory block B1, and the memory block B1 is for Channel B.

On the other hand, when the switch 44h is set ON, the bus line 30b of Channel B is disconnected to the bus line 26 provided for the memory block B1, and the memory block B1 is not used for Channel B.

In the switches 44a-44h, transmission gates 46a-46h (see FIGS. 5 and 6) are provided for the respective bus lines.

Figure 5:
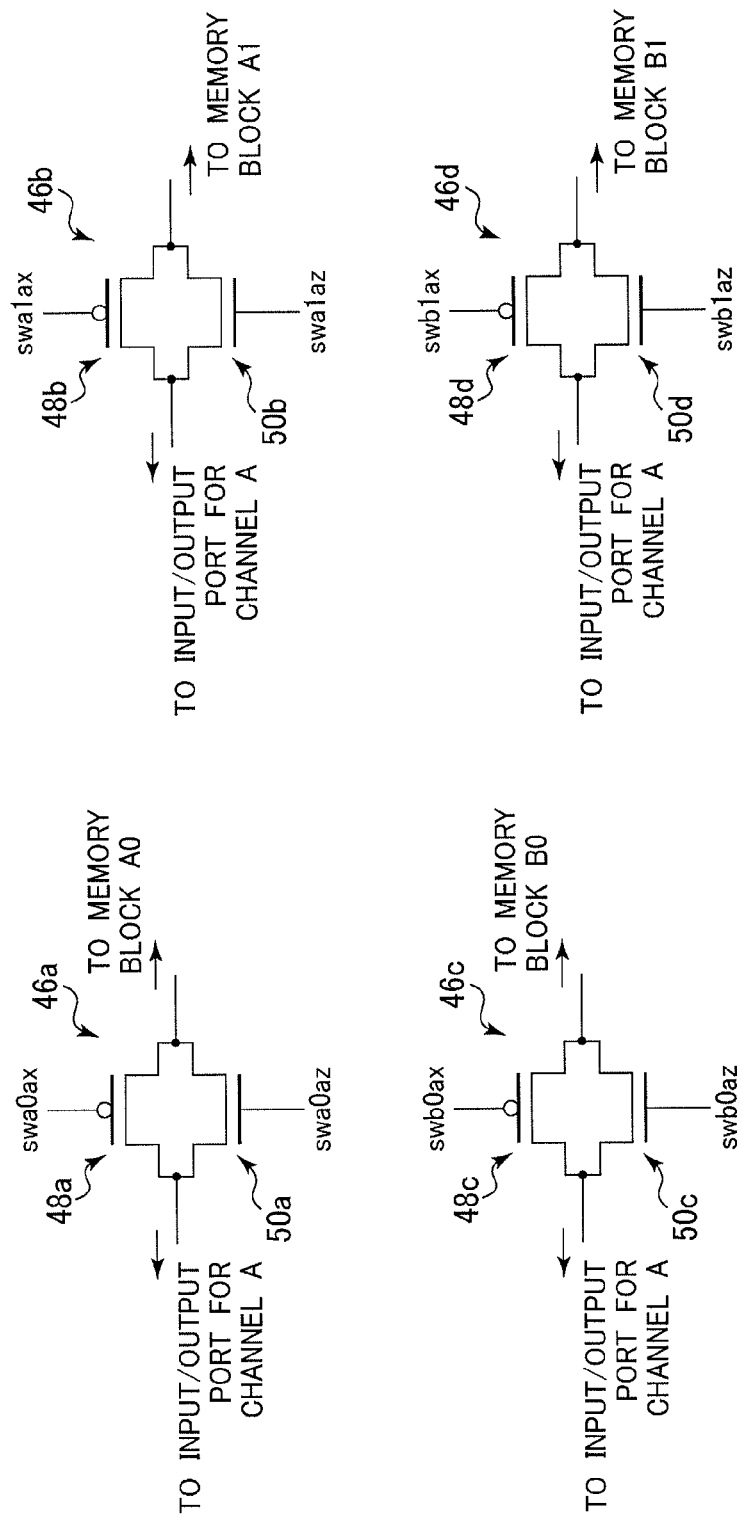
FIG. 5 is a view of the transmission gates provided in switches of the selector for Channel A of the semiconductor memory device according to the first embodiment.

FIG. 5 is a view of the transmission gates provided in the switches of the selector for Channel A.

As illustrated in FIG. 5, the transmission gates 46a-46d are respectively formed by CMOS analog switches. The respective CMOS analog switches 46a-46d are respectively formed by parallelly connecting PMOS transistors 48a-48d and NMOS transistors 50a-50d.

The transmission gate 46a of the switch 44a is turned ON when a signal swa0ax inputted to the gate of the PMOS transistor 48a is L (Low) level, and a signal swa0az inputted to the gate of the NMOS transistor 50a is H (High) level.

On the other hand, the transmission gate 46a of the switch 44a is turned OFF when a signal swa0ax inputted to the gate of the PMOS transistor 48b is H level, and a signal swa0az inputted to the gate of the NMOS transistor 50a is L level.

The transmission gate 46b of the switch 44b is turned ON when a signal swa1ax inputted to the gate of the PMOS transistor 48b is L level, and the a signal swa1az inputted to the gate of the NMOS transistor 50b is H level.

On the other hand, the transmission gate 46b of the switch 44b is turned OFF when a signal swa1ax inputted to the gate of the PMOS transistor 48b is H level, and a signal swa1az inputted to the gate of the NMOS transistor 50b is L level.

The transmission gate 46c of the switch 44c is turned ON when a signal swb0ax inputted to the gate of the PMOS transistor 48c is L level, and the signal swb0az inputted to the gate of the NMOS transistor 50c is H level.

On the other hand, the transmission gate 46c of the switch 44c is turned OFF when a signal swb0ax inputted to the gate of the PMOS transistor 48c is H level, and the signal swb0az inputted to the gate of the NMOS transistor 50c is L level.

The transmission gate 46d of the switch 44d is turned ON when a signal swb1ax inputted to the gate of the PMOS transistor 48d is L level, and a signal swb1az inputted to the gate of the NMOS transistor 50d is H level.

On the other hand, the transmission gate 46d of the switch 44d is turned OFF when a signal swb1ax inputted to the gate of the PMOS transistor 48d is H level, and a signal swb1az inputted to the gate of the NMOS transistor 50d is L level.

Figure 6:
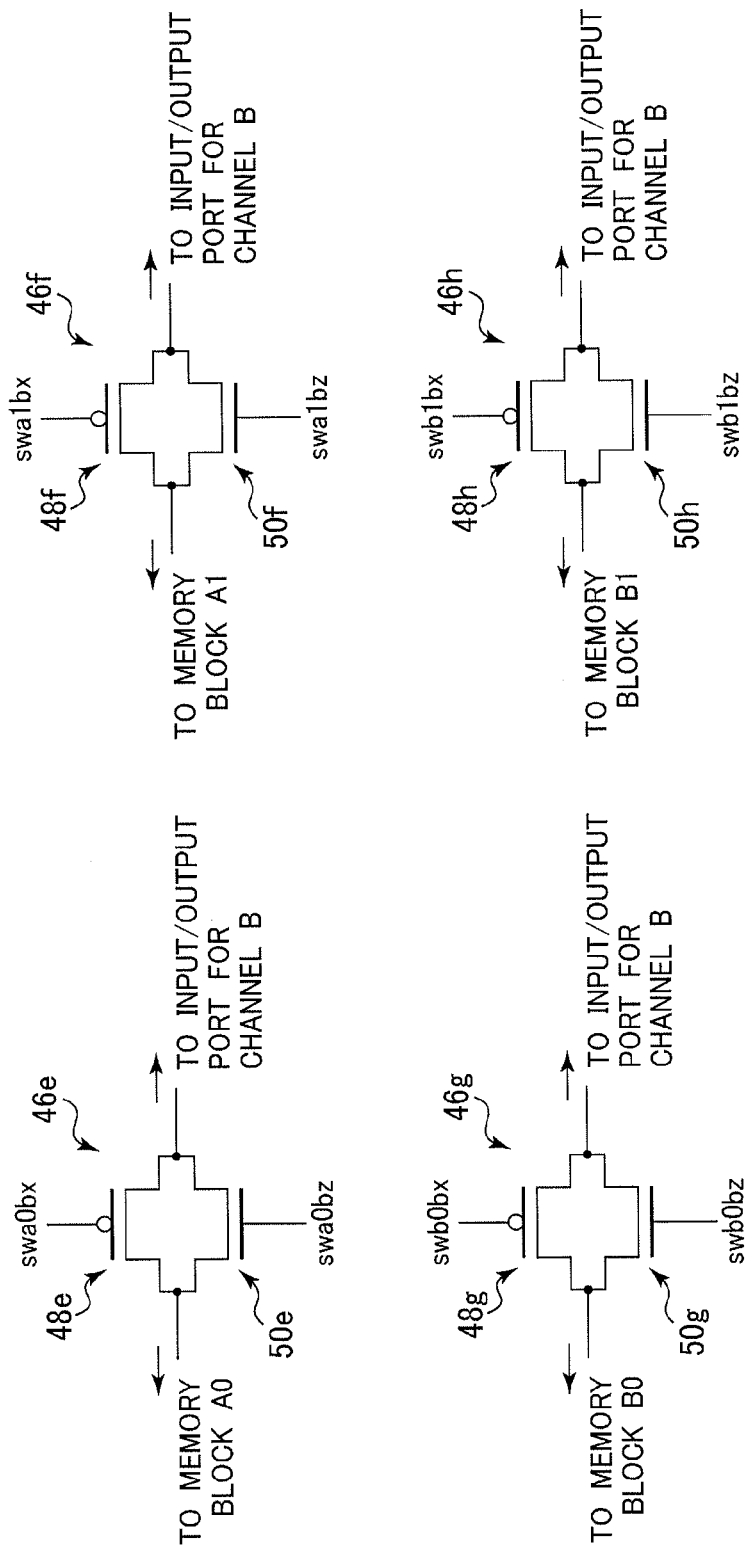
FIG. 6 is a view of the transmission gates provided in switches of the selector for Channel B of the semiconductor memory device according to the first embodiment.

FIG. 6 is a view of the transmission gates provided in the switches of the selector for Channel B.

As illustrated in FIG. 6, the transmission gates 46e-46h are respectively formed by CMOS analog switches. The respective CMOS analog switches 46e-46h are respectively formed by parallelly connecting PMOS transistors 48e-48h and NMOS transistors 50e-50h.

The transmission gate 46e of the switch 44e is turned ON when a signal swa0bx inputted to the gate of the PMOS transistor 48e is L level, and a signal swa0bz inputted to the gate of the NMOS transistor 50e is H level.

On the other hand, the transmission gate 46e of the switch 44e is turned OFF when a signal swa1bx inputted to the gate of the PMOS transistor 48e is H level, and a signal swa1bz inputted to the gate of the NMOS transistor 50e is L level.

The transmission gate 46f of the switch 44f is turned ON when a signal swa1bx inputted to the gate of the PMOS transistor 48f is L level, and a signal swa1bz inputted to the gate of the NMOS transistor 50f is H level.

On the other hand, the transmission gate 46f of the switch 44f is turned OFF when a signal swa1bx inputted to the gate of the PMOS transistor 48f is H level, and a signal swa1bz inputted to the gate of the NMOS transistor 50f is L level.

The transmission gate 46g of the switch 44g is turned ON when a signal swb0bx inputted to the gate of the PMOS transistor 48g is L level, and a signal swb0bz inputted to the gate of the NMOS transistor 50g is H level.

On the other hand, the transmission gate 46g of the switch 44g is turned OFF when a signal swb0bx inputted to the gate of the PMOS transistor 48g is H level, and a signal swb0bz inputted to the gate of the NMOS transistor 50g is L level.

The transmission gate 46h of the switch 44h is turned ON when a signal swb1bx inputted to the gate of the PMOS transistor 48h is L level, and a signal swb1bz inputted to the gate of the NMOS transistor 50h is H level.

On the other hand, the transmission gate 46h of the switch 44h is turned OFF when a signal swb1bx inputted to the gate of the PMOS transistor 48h is H level, and a signal swb1bz inputted to the gate of the NMOS transistor 50h is L level.

FIGS. 7 to 11 are circuit diagrams of the setting unit of the semiconductor device according to the present embodiment.

Figure 7:
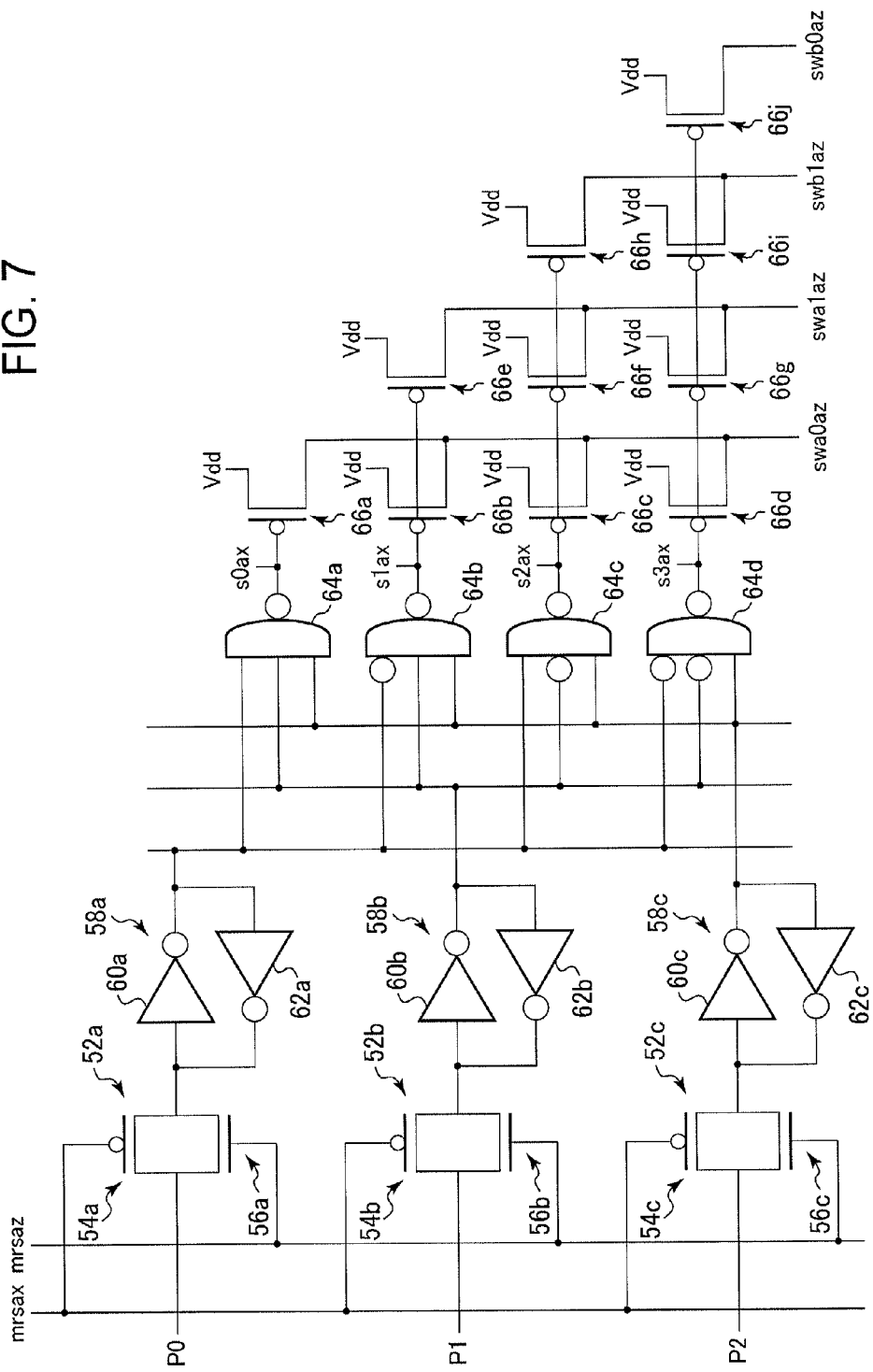
FIGS. 7 to 11 are circuit diagrams of the setting unit of the semiconductor memory device according to the first embodiment.

As illustrated in FIG. 7, signals P0-P2 indicating setting codes (mode setting codes, address codes) are connected respectively to the input terminals of transmission gates 52a-52c. The transmission gates 52a-52c are formed by CMOS analog switches. Such CMOS analog switches are respectively formed by parallelly connecting PMOS transistors 54a-54c and NMOS transistors 56a-56c. To the gates of the PMOS transistors 54a-54c of the transmission gates 52a-52c, a signal line mrsax is connected. To the gates of the NMOS transistors 56a-56c of the transmission gates 52a-52c, a signal line mrsaz is connected. When the signal line mrsax is set L level, and the signal line mrsaz is set H level, the transmission gates 52a-52c are turned ON. The transmission gates 52a-52c are set ON, whereby the signals P0-P2 indicating the setting codes can be read.

The output terminals of the transmission gates 52a-52c are connected respectively to latch circuits (latch registers, registers) 58a-58c. The latch circuits 58a-58c are formed by first inverters 60a-60c and second inverters 62a-62c respectively combined. The first inverters 60a-60c receive the data inputted via the transmission gates 52a-52c, and invert the received data, and output the inverted data. The second inverters 62a-62c receive the output data of the first inverters 60a-60c, and invert the received data, and feed back the inverted data to the inputs of the first inverters 60a-60c. The latch circuit 58a-58c retain information (setting information) based on the signals P0-P2 inputted via the transmission gates 52a-52c.

The outputs of the latch circuit 58a-58c are connected to the input terminals of logic gates (logic circuits) 64a-64d.

The logic gate 64a has the output signal s0ax of L level when all the outputs of the latch circuits 58a-58c are H level and otherwise has the output signal s0ax of H level.

The logic gate 64b has the output signal s1ax of L level when the output of the latch circuit 58a is L level, the output of the latch circuit 58b is H level, and the output of the latch circuit 58c is H level. When the outputs of the latch circuit 58a-58c are otherwise, the output signal s1ax of the logic gate 64b is H level.

The logic gate 64c has the output signal s2ax of L level when the output of the latch circuit 58a is H level, the output of the latch circuit 58b is L level, and the output of the latch circuit 58c is H level. When the outputs of the latch circuits 58a-58c are otherwise, the output signal s2ax of the logic gate 64c is H level.

The logic gate 64d has the output signal s3ax of L level when the output of the latch circuit 58a is L level, the output of the latch circuit 58b is L level, and the output of the latch circuit 58c is H level. When the outputs of the latch circuits 58a-58c are otherwise, the output signal s3ax of the logic gate 64d is H level.

The output terminals of the logic gates 64a-64d are connected respectively to the gates of the PMOS transistors 66a-66d. The sources of the PMOS transistors 66a-66d are connected respectively to a power supply voltage Vdd. When the outputs of the logic gates 64a-64d are L level, the PMOS transistors 66a-66d are turned ON.

A signal line swa0az is connected to the drains of the plural MOS transistors 66a-66d having the gates respectively connected to the outputs of the logic gates 64a-64d. The signal swa0az is H level when one of the outputs s0ax, s1ax, s2ax, s3ax of the logic gate 64a-64d is L level.

As described above, the signal line swa0az is connected to the gate of the NMOS transistor 50a of the transmission gate 46a provided in the switch 44a of the selector 28a on the side of Channel A.

Figure 9:

The signal swa0az is connected to the input terminal of an inverter 68a (see FIG. 9). The inverter 68a receives and inverts the signal swa0az and outputs a signal swa0ax. The signal swa0ax is connected to the gate of the PMOS transistor 48a of the transmission gate 46a provided in the switch 44a of the selector 28a on the side of Channel A.

Figure 10:
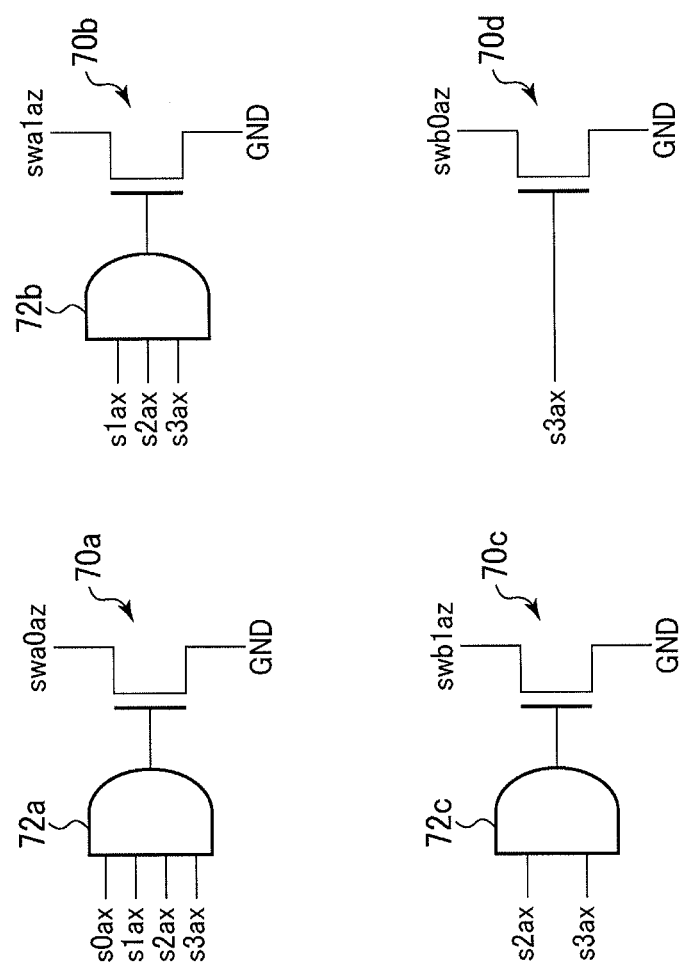

The signal line swa0az is connected to the drain of an NMOS transistor 70a (see FIG. 10). The source of the NMOS transistor 70a is grounded (GND). To the gate of the NMOS transistor 70a, the output terminal of a logic gate 72a is connected. To the input terminal of the logic gate 72a, the output signals s0ax, s1ax, s2ax, s3ax of the logic gates 64a-64d are inputted. The logic gate 72a has the output of H level when the output signals s0ax, s1ax, s2ax, s3ax of the logic gates 64a-64d are all H level. When the output signals s0ax, s1ax, s2ax, s3ax of the logic gates 64a-64d are all H level, the output of the logic gate 72a is H level, and the NMOS transistor 70a is turned ON, and the signal swa0az is L level.

The output terminals of the logic gates 64b-64d are connected respectively to the gates of PMOS transistors 66e-66g. The sources of the PMOS transistors 66e-66g are connected respectively to the power supply voltage Vdd. When the outputs of the logic gates 64b-64d are L level, the PMOS transistors 66e-66g are turned ON.

A signal line swa1az is connected to the drains of the plural PMOS transistors 66e-66g having the gates respectively connected to the outputs of the logic gates 64b-64d. The signal swa1az is H level when one of the outputs s1ax, s2ax, s3ax of the logic gates 64b-64d is L level.

As described above, the signal line swa1az is connected to the gate of the NMOS transistor 50b of the transmission gate 46b provided in the switch 44b of the selector 28a on the side of Channel A.

The signal swa1az is connected to the input terminal of the inverter 68b (see FIG. 9). The inverter 68b receives and inverts the signal swa1az and outputs a signal swa1ax. The signal swa1ax is connected to the gate of the PMOS transistor 48b of the transmission gate 46b provided in the switch 44b of the selector 28a on the side of Channel A.

A signal line swa1az is connected to the drain of an NMOS transistor 70b (see FIG. 10). The source of the NMOS transistor 70b is grounded (GND). To the gate of the NMOS transistor 70b, the output terminal of a logic gate 72b is connected. To the input terminal of the logic gate 72b, output signals s1ax, s2ax, s3ax of the logic gates 64b-64d are inputted. The logic gate 72b has the output of H level when the output signals s1ax, s2ax, s3ax of the logic gates 64b-64d are all H level. When the output signals s1ax, s2ax, s3ax of the logic gates 64b-64d are all H level, the output of the logic gate 72b is H level, and the NMOS transistor 70b is turned ON, and the signal swa1az is L level.

The output terminals of the logic gates 64c, 64d are connected respectively to the gates of PMOS transistors 66h, 66i. The sources of the PMOS transistors 66h, 66i are connected respectively to the power supply voltage Vdd. when the outputs of the logic gates 64c, 64d are L level, the PMOS transistors 66h, 66i are turned ON.

A signal line swb1az is connected to the drains of the plural PMOS transistors 66h, 66i having the gates respectively connected to the outputs of the logic gates 64c, 64d. The signal swb1az is H level when one of the outputs s2ax, s3ax of the logic gates 64c, 64d is L level.

As described above, the signal line swb1az is connected to the gate of the NMOS transistor 50d of the transmission gate 46d provided in the switch 44d of the selector 28a on the side of Channel A.

A signal swb1az is connected to the input terminal of the inverter 68d (see FIG. 9). The inverter 68d receives and inverts the signal swb1az and outputs a signal swb1ax. The signal swb1ax is connected to the gate of the PMOS transistor 48d of the transmission gate 46d provided in the switch 44d of the selector 28a on the side of Channel A.

The signal line swb1az is connected to the drain of an NMOS transistor 70c (see FIG. 10). The source of the NMOS transistor 70c is grounded (GND). To the gate of the NMOS transistor 70c, the output terminal of the logic gate 72c is connected. To the input terminal of the logic gate 72c, the output signals s2ax, s3ax of the logic gates 64c, 64d are inputted. The logic gate 72c has the output of H level when the outputs signals s2ax, s3ax of the logic gates 64c, 64d are all H level. When the output signals s2ax, s3ax of the logic gates 64c, 64d are all H level, the output of the logic gate 72c is H level, and the NMOS transistor 70c is turned ON, and the signal swb1az is L level.

The output terminal of the logic gate 64d is connected to the gate of a PMOS transistor 66j. The source of the PMOS transistor 66j is connected to the power supply voltage Vdd. When the output of the logic gate 64d is L level, the PMOS transistor 66j is turned ON.

A signal line swb0az is connected to the drain of a PMOS transistor 66j having the gate connected to the output of the logic gate 64d. The signal swb0az is H level when the output s3ax of the logic gate 64d is L level.

As described above, the signal line swb0az is connected to the gate of the NMOS transistor 50c of the transmission gate 46c provided in the switch 44c of the selector 28a on the side of Channel A.

The signal swb0az is connected to the input terminal of an inverter 68c (see FIG. 9). The inverter 68c receives and inverts the signal swb0az and outputs a signal swb0ax. The signal swb0ax is connected to the gate of the PMOS transistor 48c of the transmission gate 46c provided in the switch 44c of the selector 28c on the side of Channel A.

The signal line swb0az is connected to the drain of an NMOS transistor 70d (see FIG. 10). The source of the NMOS transistor 70d is grounded (GND). To the gate of the NMOS transistor 70d, the output signal s3ax of the logic gate 64d is inputted. When the output signal s3ax of the logic gate 64d is H level, the NMOS transistor 70d is turned ON, and the signal swb0az is L level.

Figure 8:
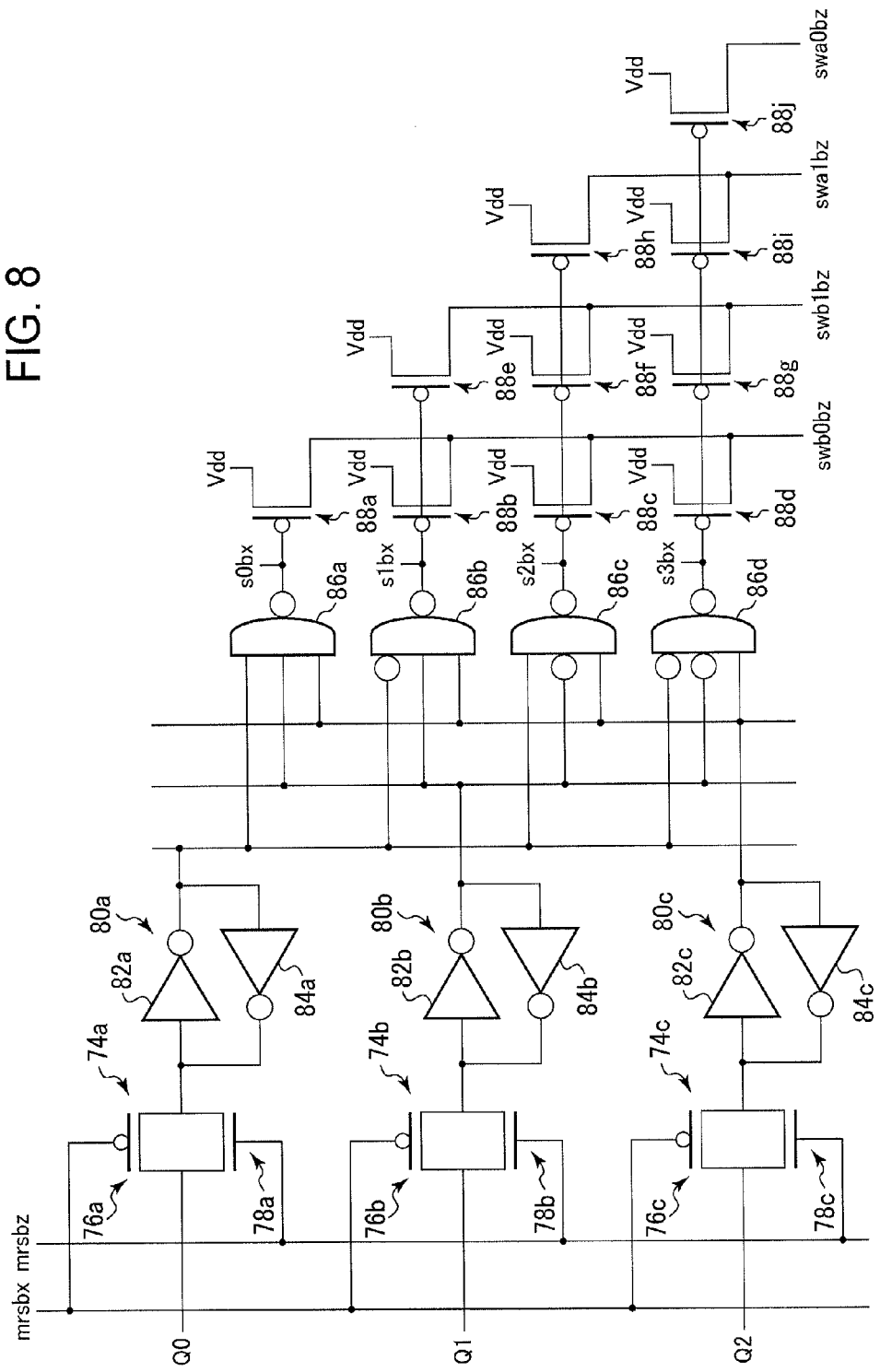

As illustrated in FIG. 8, signals Q0-Q2 indicating setting codes are connected respectively to the input terminals of transmission gates 74a-74c. The transmission gates 74a-74c are formed by CMOS analog switches. Such CMOS analog switches are formed by parallelly connecting PMOS transistors 76a-76c and NMOS transistors 78a-78c, respectively. To the gates of the PMOS transistors 76a-76c of the transmission gates 74a-74c, a signal line mrsbx is connected. To the gates of the NMOS transistors 78a-78c of the transmission gates 74a-74c, a signal line mrsbz is connected. When the signal mrsbx is set L level, and the signal mrsbz is set H level, the transmission gates 74a-74c are turned ON. By turning ON the transmission gates 74a-74c, it is possible to read the signals Q0-Q2 indicating the setting codes.

The output terminals of the transmission gates 74a-74c are connected respectively to latch circuits (latch registers, registers) 80a-80c. The latch circuits 80a-80c are formed by first inverters 82a-82c and second inverters 84a-84c respectively combined. The first inverters 82a-82c receive, invert and output data inputted via the transmission gates 74a-74c. The second inverters 84a-84c receive and invert the output data of the first inverters 82a-82c, and feed back the inverted output data to the input of the first inverter 82a-82c. The latch circuits 80a-80c retain information (setting information) based on the signals Q0-Q2 inputted via the transmission gates 74a-74c.

The outputs of the latch circuits 80a-80c are connected to the input terminals of logic gates 86a-86d.

The logic gate 86a has the output signal s0bx of L level when the outputs of the latch circuits 80a-80c are all H level, and otherwise, the output signal s0bx is H level.

The logic gate 86b has the output signal s1bx of L level when the output of the latch circuit 80a is L level, the output of the latch circuit 80b is H level, and the output of the latch circuit 80c is H level. When the output of the latch circuit 80a-80c are otherwise, the output signal s1bx of the logic gate 86b is H level.

The logic gate 86c has the output signal s2bx of L level when the output of the latch circuit 80a is H level, the output of the latch circuit 80b is L level, and the output of the latch circuit 80c is H level. When the outputs of the latch circuit 80a-80c are otherwise, the output signal s2bx of the logic gate 86c is H level.

The logic gate 86d has the output signal s3bx of L level when the output of the latch circuit 80a is L level, the output of the latch circuit 80b is L level, and the output of the latch circuit 80c is H level. When the outputs of the latch circuits 80a-80c are otherwise, the output signal s3bx of the logic gate 86d is H level.

The output terminals of the logic gates 86a-86d are connected respectively to the gates of the PMOS transistors 88a-88d. The sources of the PMOS transistors 88a-88d are connected to the power supply voltage Vdd. When the outputs of the logic gates 86a-86d are L level, the PMOS transistors 88a-88d are turned ON.

The signal line swb0bz is connected to the drains of the plural PMOS transistors 88a-88d having the gates respectively connected to the outputs of the logic gates 86a-86d. The signal swb0bz is H level when one of the outputs s0bx, s1bx, s2bx, s3bx of the logic gates 86a-86d is L level.

As described above, the signal line swb0bz is connected to the gate of the NMOS transistor 50g of the transmission gate 46g provided in the switch 44g of the selector 28b on the side of Channel B.

The signal swb0bz is connected to the input terminal of an inverter 90c (see FIG. 9). The inverter 90c receives and inverts the signal swb0bz and outputs a signal swb0bx. The signal swb0bx is connected to the gate of the PMOS transistor 48g of the transmission gate 46g provided in the switch 44g of the selector 28b on the side of Channel B.

Figure 11:
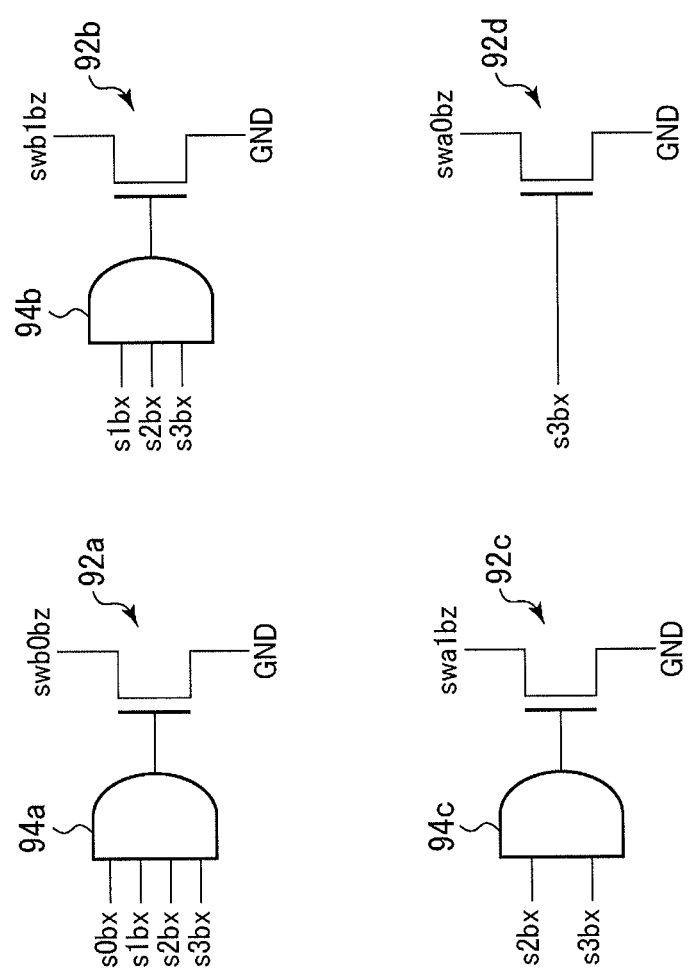

The signal line swb0bz is connected to the drain of an NMOS transistor 92a (see FIG. 11). The source of the NMOS transistor 92a is grounded (GND). To the gate of the NMOS transistor 92a, the output terminal of a logic gate 94a is connected. To the input terminal of the logic gate 94a, the output signal s0bx, s1bx, s2bx, s3bx of the logic gates 86a-86d are inputted. The logic gate 94a has the output signal of H level when the output signals s0bx, s1bx, s2bx, s3bx of the logic gates 86a-86d are all H level. When the output signals s0bx, s1bx, s2bx, s3bx of the logic gates 86a-86d are all H level, the output of the logic gate 94a is H level, the NMOS transistor 92a is turned ON, and the signal swb0bz is L level.

The output terminals of the logic gates 86b-86d are connected respectively to the gates of PMOS transistors 88e-88g. The sources of the PMOS transistors 88e-88g are connected respectively to the power supply voltage Vdd. When the outputs of the logic gates 86b-86d are L level, the PMOS transistors 88e-88g are turned ON.

The signal line swb1bz is connected to the drains of the plural PMOS transistors 88e-88g having the gates respectively connected to the outputs of the logic gates 86b-86d. The signal swb1bz is H level when one of the outputs s1bx, s2bx, s3bx of the logic gates 86b-86d is L level.

As described above, the signal line swb1bz is connected to the gate of the NMOS transistor 50h of the transmission gate 46h provided in the switch 44h of the selector 28b on the side of Channel B.

The signal swb1bz is connected to the input terminal of an inverter 90d (see FIG. 9). The inverter 90d receives and inverts the signal swb1bz and outputs a signal swb1bx. The signal swb1bx is connected to the gate of the PMOS transistor 48h of the transmission gate 46h provided in the switch 44h of the selector 28b on the side of Channel B.

The signal line swb1bz is connected to the drain of an NMOS transistor 92b (see FIG. 11). The source of the NMOS transistor 92b is grounded (GND). To the gate of the NMOS transistor 92b, the output terminal of a logic gate 94b is connected. To the input terminal of the logic gate 94b, output signals s1bx, s2bx, s3bx of the logic gates 86b-86d are inputted. The logic gate 94b has the output signal of H level when the output signals s1bx, s2bx, s3bx of the logic gates 86b-86d are all H level. When the output signals s1bx, s2bx, s3bx of the logic gates 86b-86d are all H level, the output of the logic gates 94b is H level, the NMOS transistor 92b is turned ON, and the signal swb1bz is L level.

The output terminals of the logic gates 86c, 86d are connected respectively to the gates of PMOS transistors 88h, 88i. The sources of the PMOS transistors 88h, 88i are connected respectively to the power supply voltage Vdd. When the outputs of the logic gates 86c, 86d are L level, the PMOS transistors 88h, 88i are turned ON.

The signal line swa1bz is connected to the drains of the plural PMOS transistors 88h, 88i having the gates respectively connected to the outputs of the logic gates 86c, 86d. The signal swa1bz is H level when one of the outputs s2bx, s3bx of the logic gates 86c, 86d is L level.

As described above, the signal swa1bz is connected to the gate of the NMOS transistor 50f of the transmission gate 46f provided in the switch 44f of the selector 28b on the side of Channel B.

The signal swa1bz is connected to the input terminal of an inverter 90b (see FIG. 9). The inverter 90b receives and inverts the signal swa1bz and outputs a signal swa1bx. The signal swa1bx is connected to the gate of the PMOS transistor 48f of the transmission gate 46f provided in the switch 44f of the selector 28b on the side of Channel B.

The signal line swa1bz is connected to the drain of an NMOS transistor 92c (see FIG. 11). The source of the NMOS transistor 92c is grounded (GND). To the gate of the NMOS transistor 92c, the output terminal of the logic gate 94c is connected. To the input terminal of the logic gate 94c, the output signals s2bx, s3bx of the logic gate 86c, 86d are inputted. The logic gate 94c has the output of H level when the output signals s2bx, s3bx of the logic gates 86c, 86d are all H level. When the output signals s2bx, s3bx of the logic gates 86c, 86d are all H level, the output of the logic gate 94c is H level, the NMOS transistor 92c is turned ON, and the signal swa1bz is L level.

The output terminal of the logic gate 86d is connected to the gate of a PMOS transistor 88j. The source of the PMOS transistor 88j is connected to the power supply voltage Vdd. When the output of the logic gate 86d is L level, the PMOS transistor 88j is turned ON.

A signal line swa0bz is connected to the drain of the PMOS transistor 88j having the gate connected to the output of the logic gate 86d. The signal swa0bz is H level when the output s3bx of the logic gate 86d is L level.

As described above, the signal line swa0bz is connected to the gate of the NMOS transistor 50e provided in the switch 44e of the selector 28b on the side of Channel B.

The signal swa0bz is connected to the input terminal of the inverter 90a (see FIG. 9). The inverter 90a receives and inverts the signal swa0bz and outputs a signal swa0bx. The signal swa0bx is connected to the gate of the PMOS transistor 48e of the transmission gate 46e provided in the switch 44e of the selector 28b on the side of Channel B.

The signal line swa0bz is connected to the drain of an NMOS transistor 92d (see FIG. 11). The source of the NMOS transistor 92d is grounded (GND). To the gate of the NMOS transistor 92d, the output signal s3bx of the logic gate 86d is inputted. When the output signal s3bx of the logic gate 86d is H level, the NMOS transistor 92d is turned ON, and the signal swa0bz is L level.

FIG. 12 is the setting table of the semiconductor memory device according to the present embodiment.

Setting A-I is for making the memory block A0 alone usable for Channel A. The signal P0 is set L level, the signal P1 is set L level, and the signal P2 is set L level (see FIG. 7). When the signal P0 is set L level, the signal P1 is set L level, and the signal P2 is set L level, and the transmission gates 52a-52c are turned ON, the output s0ax of the logic gate 64a is L level, and the outputs s1ax, s2ax, s3ax of the logic gates 64b-64d are H level. Then, the signal swa0az is H level, and the signals swa1az, swb1az, swb1az are L level. The signal swa0ax is L level, and the signals swa1ax, swb1ax, swb0ax are H level. Thus, the transmission gate 46a of the switch 44a is turned ON, and the transmission gates 46b-46d of the switch 44b-44d are turned OFF. Thus, the memory block A0 is usable for Channel A, and memory blocks A1, B0, B1 are not usable for Channel A.

Setting A-II is for making the memory blocks A0, A1 usable for Channel A. In this case, the signal P0 is set H level, the signal P1 is set L level, and the signal P2 is set L level. When the signal P0 is set H level, the signal P1 is set L level, and the signal P2 is set L level, and the transmission gates 52a-52c are turned ON, the output s1ax of the logic gate 64b is L level, and the outputs s0ax, s2ax, s3ax of the logic gates 64a, 64c, 64d are H level. Then, the signals swa0az, swa1az are H level, and the signals swb1az, swb0az are L level. Also, the signals swa0ax, swa1ax are L level, and the signals swb1ax, swb0ax are H level. Thus, the transmission gates 46a, 46b of the switches 44a, 44b are turned ON, and the transmission gates 46c, 46d of the switches 44c, 44d are turned OFF. Thus, the memory blocks A0, A1 are usable for Channel A, and the memory blocks B0, B1 are not usable for Channel A.

Setting A-III is for making the memory blocks A0, A1, B1 usable for Channel A. In this case, the signal P0 is set L level, the signal P1 is set H level, and the signal P2 is set L level. When the signal P0 is set L level, the signal P1 is set H level, and the signal P2 is set L level, and the transmission gates 52a-52c are turned ON, the output s2ax of the logic gate 64c of the logic gate 64c is L level, and the outputs s0ax, s1ax, s3ax of the logic gates 64a, 64b, 64d are respectively H level. Then, the signals swa0az, swa1az, swb1az are H level, and the signal swb0az is L level. Also, the signals swa0ax, swa1ax, swb1ax are L level, and the signal swb0ax is H level. Thus, the transmission gates 46a, 46b, 46d of the switches 44a, 44b, 44d are turned ON, and the transmission gate 46c of the switch 44c is turned OFF. Thus, the memory blocks A0, A1, B1 are usable for Channel A, and the memory block B0 is made unusable for Channel A.

Setting A-IV is for making the memory blocks A0, A1, B0, B1 usable for Channel A. In this case, the signal P0 is set H level, the signal P1 is set H level, and the signal P2 is set L level. When the signal P0 is set H level, the signal P1 is set H level, and the signal P2 is set L level, and the transmission gates 52a-52c are turned ON, the output s3ax of the logic gate 64d is L level, the outputs s0ax, s1ax, s2ax of the logic gates 64a, 64b, 64c are respectively H level. Then, the signals swa0az, swa1az, swb1az, swb1az are H level, and the signals swa0ax, swa1ax, swb1ax, swb0ax are L level. Thus, the transmission gates 46a-46d of the switches 44a-44d are turned ON. Thus, the memory blocks A0, A1, B0, B1 are made usable for Channel A.

As described above, the information corresponding to the signals P0-P2 indicating the setting codes is retained by the latch circuits 58a-58c, and based on the setting information retained by the latch circuits 58a-58c, the connection of the selector 28a is set.

Setting B-I is for making the memory block B0 alone usable for Channel B. In this case, the signal Q0 is set L level, the signal Q1 is set L level, and the signal Q2 is set L level (see FIG. 8). When the signal Q0 is set L level, the signal Q1 is set L level, and the signal Q2 is set L lever, and the transmission gates 74a-74c are turned ON, the output s0bx of the logic gate 86a is L level, and the outputs s1bx, s2bx, s3bx of the logic gates 86b-86d are H level. Then, the signal swb0bz is H level, and the signals swb1bz, swa1bz, swa0bz are L level. Also, the signals swb0bx is L level, and the signals swb1bx, swa1bx, swa0bx are H level. Thus, the transmission gates 46e of the switches 44g is turned ON, and the transmission gates 46e, 46f, 46h of the switches 44e, 44f, 44h are turned OFF. Thus, the memory blocks B0 is made usable for Channel B, and the memory bocks A0, A1, B1 are made unusable for Channel B.

Setting B-II is for making the memory block B0 and the memory block B1 usable for Channel B. In this case, the signal Q0 is set H level, the signal Q1 is set L level, and the signal Q2 is set L level. When the signal Q0 is set H level, the signal Q1 is set L level, and the signal Q2 is let L level, and the transmission gates 74a-74c are turned ON, the output s1bx of the logic gate 86b is L level, and the outputs s0bx, s2bx, s3bx of the logic gates 86a, 86c, 86d are H level. Then, the signals swb0bz, swb1bz are H level, and the signals swa1bz, swa0bz are L level. Also, the signals swb0bx, swb1bx are L level, and the signals swa1bx, swa0bx are H level. Thus, the transmission gates 46g, 46h of the switches 44g, 44h are turned ON, and the transmission gates 46e, 46f of the switches 44e, 44f are turned OFF. Thus, the memory blocks B0, B1 are made usable for Channel B, and the memory blocks A0, A1 are made unusable for Channel B.

Setting B-III is for making the memory block B0, the memory block B1 and the memory block A1 usable for Channel B. In this case, the signal Q0 is set L level, the signal Q1 is set H level, and signal Q2 is set L level. When the signal Q0, the signal Q1 and the signal Q2 are set L level, and the transmission gates 74a-74c are turned ON, the output s2bx of the logic gate 86c is L level, and the outputs s0bx, s1bx, s3bx of the logic gates 86a, 86b, 86d are H level. Then, the signals swb0bz, swb1bz, swa1bz are H level, and the signal swa0bz is L level. Also, the signals swb0bx, swb1bx, swa1bx are L level, and the signal swa0bx is H level. Thus, the transmission gates 46g, 46h, 46f of the switches 44g, 44h, 44f are turned ON, and the transmission gate 46e of the switch 44e is turned OFF. Thus, the memory blocks B0, B1, A1 are made usable for Channel B, and the memory block A0 is made unusable for Channel B.

Setting B-IV is for making the memory block B0, the memory block B1, the memory block A0 and the memory block A1 usable for Channel B. In this case, the signal Q0 is set H level, the signal Q1 is set H level, and the signal Q2 is set L level. When the signal Q0 is set H level, the signal Q1 is set H level, and the signal Q2 is set L level, and the transmission gates 74a-74c are turned ON, the output s3bx of the logic gate 86d is L level, and the outputs s0bx, s1bx, s2bx of the logic gates 86a, 86b, 86c are H level. Then, the signals swb0bz, swb1bz, swa1bz, swa0bz are H level. Also, the signals swb0bx, swb1bx, swa1bx, swa0bx are L level. Thus, the transmission gates 46g, 46h, 46e, 46f of the switches 44g, 44h, 44e, 44f are turned ON. Thus, the memory blocks B0, B1, A0, A1 are made usable for Channel B.

As described above, information corresponding to the signals Q0-Q2 indicating the setting codes is retained by the latch circuits 80a-80c, and based on the setting information retained by the latch circuits 80a-80c, the connection of the selector 28b is set.

Figure 13:
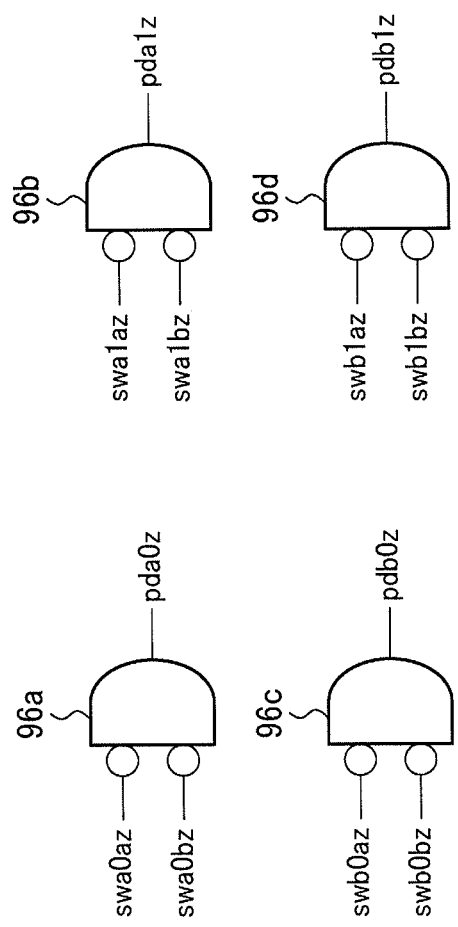
FIG. 13 is a power supply control circuit of the semiconductor memory device according to the first embodiment.

FIG. 13 is the power supply control circuit of the semiconductor memory device according to the present embodiment.

To the logic gate 96a, a signal swa0az and a signal swa0bz are inputted. The logic gate 96a has the output signal pda0z of H level when the input signal swa0az and the input signal swa0bz are both L level. The signal swa0az is L level when the memory block A0 is not used for Channel A. The signal swa0bz is L level when the memory block A0 is not used for Channel B. Accordingly, when the memory block A0 is used neither for Channel A nor for Channel B, the output pda0z of the logic gate 96a is H level.

To the logic gate 96b, a signal swa1az and a signal swa1bz are inputted. The logic gate 96b has the output signal pda1z of H level when the input signal swa1az and the input signal swa1bz are all L level. The signal swa1az is L level when the memory block A1 is not used for Channel A. The signal swa1bz is L level when the memory block A1 is not used for Channel B. Accordingly, when the memory block A1 is used neither for Channel A nor for Channel B, the output pda1z of the logic gate 96b is H level.

To the logic gate 96c, a signal swb0az and a signal swb0bz are inputted. The logic gate 96c has the output signal pdb0z of H level when the input signal swb0az and the input signal swb0bz are all L level. The signal swb0az is L level when the memory block B0 is not used for Channel A. The signal swb0bz is L level when the memory block B0 is not used for Channel B. Accordingly, when the memory block B0 is used neither for Channel A nor for Channel B, the output pdb0z of the logic gate 96c is H level.

To the logic gate 96d, a signal swb1az and a signal swb1bz are inputted. The logic gate 96d has the output signal pdb1z of H level when the input signal swb1az and the input signal swb1bz are all L level. The signal swb1az is L level when the memory block B1 is not used for Channel A. The signal swb1bz is L level when the memory block B1 is not used for Channel B. Accordingly, when the memory block B1 is used neither for Channel A nor for Channel B, the output pdb1z of the logic gate 96d is H level.

The output signals pda0z, pda1z, pdb0z, pdb1z of the logic gates 96a-96d of the power supply control circuit 42 are inputted respectively to the power supply circuits 40a-40d.

The power supply circuit 40a supplies the power source to the memory block A0 when the input signal pda0z is L level. On the other hand, when the input signal pda0z is H level, the power supply circuit 40a does not supply the power source to the memory block A0. Accordingly, when the memory block A0 is used neither for Channel A nor for Channel B, the power source is not supplied to the memory block A0.

The power supply circuit 40b supplies the power source to the memory block A1 when the input signal pda1z is L level. On the other hand, when the input signal pda1z is H level, the power supply circuit 40a does not supply the power source to the memory block A1. Accordingly, when the memory block A1 is used neither for Channel A nor for Channel B, the power source is not supplied to the memory block A1.

The power supply circuit 40c supplies the power source to the memory block B0 when the input signal pdb0z is L level. On the other hand, when the input signal pdb0z is H level, the power supply circuit 40c does not supply the power source the memory block B0. Accordingly, when the memory block B0 is used neither for Channel A nor for Channel B, the power source is not supplied to the memory block B0.

The power supply circuit 40d supplies the power source to the memory block B1 when the inputs signal pdb1z is L level. On the other hand, the power supply circuit 40d does not supply the power source to the memory block B1 when the input signal pdb1z is H level. Accordingly, when the memory block B1 is used neither for Channel A nor for Channel B, the power source is not supplied to the memory block B1.

When the memory blocks A0, A1, B0, B1 are used neither for Channel A nor for Channel B, the power source is not supplied to the memory blocks A0, A1, B0, B1, which can save the power.

Figure 14:
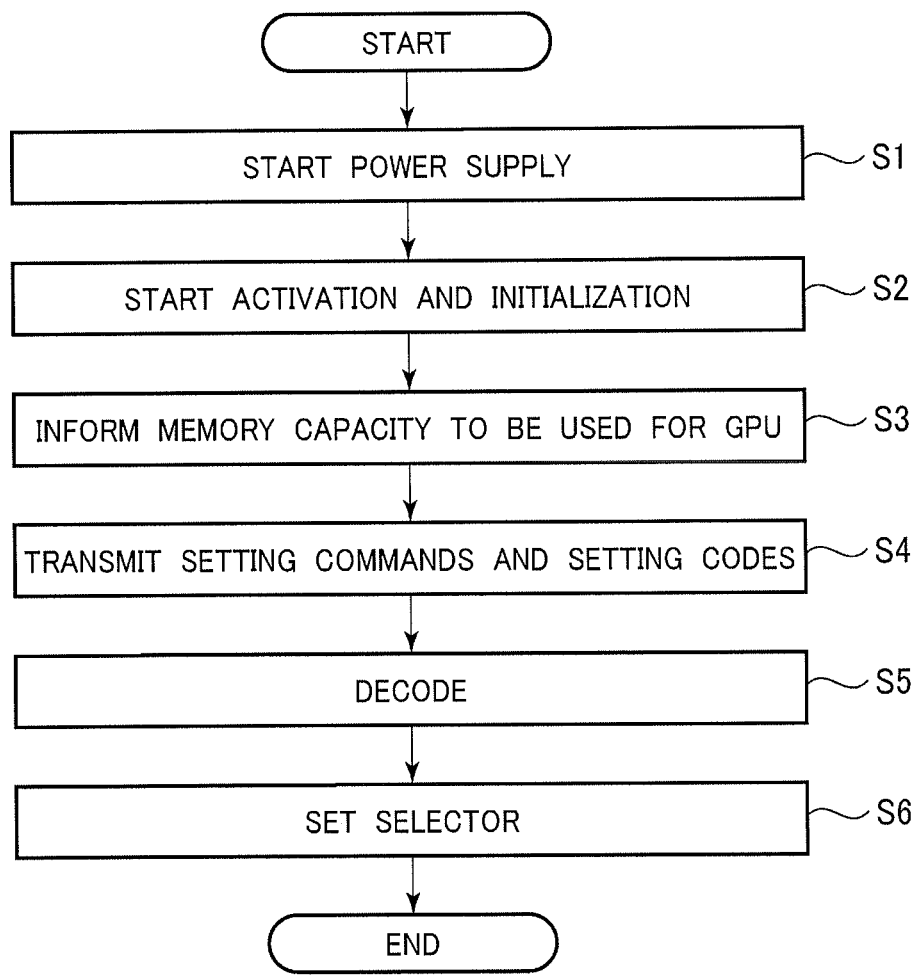
FIG. 14 is a flow chart of an operation of the electronic device according to the first embodiment.

Next, the operation of the electronic device according to the present embodiment will be described with reference to FIG. 14. FIG. 14 is the flow chart of the operation of the electronic device according to the present embodiment.

The power source is supplied to the electronic device according to the present embodiment (Step S1).

Next, when the supply of the power source to the electronic device is started, the SOC 12 starts to be activated while the semiconductor memory device 10 starts to be initialized (Step S2). The semiconductor memory device 10 initializes the internal circuit (not illustrated).

Next, the GPU 16 informs via the bus line 20 the CPU 14 of the information of a memory capacity to be used for GPU 16 (S3). The CPU 14 stores in the memory resource controller 15 the information of the memory capacity to be used for the GPU 16 informed by the GPU 16. The CPU 14 can use a memory capacity given by subtracting the memory capacity for the GPU 16 from the memory capacity of the semiconductor memory device 10. When the memory capacity of each memory block A0-B1 is, e.g., 32 Mbits, the total capacity of the memory blocks A0-B1 of the semiconductor memory device is, e.g., 128 Mbits. When the memory capacity to be used by the GPU 16 is, e.g., 32 Mbits, the CPU 14 can use the memory capacity of, e.g., 96 Mbits. When the CPU 14 accesses to, e.g., Channel A of the semiconductor memory device 10, by using Setting A-III illustrated in FIG. 12, the CPU 14 can use the memory capacity of, e.g., 96 Mbits. When the GPU 16 accesses to, e.g., Channel B of the semiconductor memory device 10 by using Setting B-I illustrated in FIG. 12, the GPU 16 can use the memory capacity of, e.g., 32 Mbits.

Then, the CPU 14 transmits setting commands (command register commands) for setting the setting units 38a, 38b to the input/output ports 22a, 22b via the memory controllers 18a, 18b (Step S4). At this time, the CPU 14 transmits together with the setting commands the information of the signals P0-P2, Q0-Q2 indicating the setting codes to the input/output ports 22a, 22b via the memory controllers 18a, 18b. When the setting code for Channel A is, e.g., A-III (see FIG. 12), for example, the signals indicating the setting code are P0=0 (L level), P1=1 (H level), P2=0 (L level). When the setting for Channel B is, e.g., B-I (see FIG. 12), for example, the signals indicating the setting code are P0=0 (L level), P1=0 (L level) and P2=0 (L level).

Such setting commands set L level the signal line mrsax connected to the gates of the PMOS transistors 54a-54c of the transmission gates 52a-52c. Such setting commands set H level the signal line mrsaz connected to the gates of the NMOS transistors 56a-56c of the transmission gates 52a-52c. Thus, the transmission gates 52a-52c are turned ON. The transmission gates 52a-52c are turned ON, and the signals P0-P2 indicating the setting codes are read.

Such setting commands set L level the signal line mrsbx connected to the gates of the PMOS transistors 76a-76c of the transmission gates 74a-74c. Such commands set H level the signal line mrsbz connected to the gates of the NMOS transistors 78a-78c of the transmission gate 74a-74c. Thus, the transmission gates 74a-74c are turned ON. The transmission gates 74a-74c are turned ON, and the signals Q0-Q2 indicating the setting code are read.

The signals P0-P2, Q0-Q2 read via the transmission gates 52a-52c, 74a-74c are retained respectively by the latch circuits 58a-58c, 80a-80c and are decoded by the setting units 38a, 38b (Step S5).

When the decoding is performed by the setting units 38a, 38b, the selectors 28a, 28b is set by the setting unit 38a, 38b (Step S6).

Specifically, signals swa0ax, swa0az, swa1ax, swa1az, swb0ax, swb0az, swb1ax, swb1az indicating the result of the decoding by the setting unit 38a are inputted from the setting unit 38a to the selector 28a. When the setting for Channel A is A-III, the signals swa0az, swa1az, swb1az are H level, and the signal swb0az is L level. The signals swa0ax, swa1ax, swb1ax are L level, and the signal swb0ax is H level. Thus, the transmission gates 46a, 46b, 46d of the switches 44a, 44b, 44d are turned ON, and the transmission gate 46c of the switch 44c is turned OFF. Thus, the memory blocks A0, A1, B1 are made usable for Channel A, and the memory block B0 is made unusable for Channel A.

The signals swa0bx, swa0bz, swa1bx, swa1bz, swb0bx, swb0bz, swb1bx, swb1bz indicating the result of the decoding by the setting unit 38b is inputted from the setting unit 38b to the selector 28b. When the setting for Channel B is B-I, the signal swb0bz is H level, and the signals swb1bz, swa1bz, swa0bz are L level. The signals swb0bx is L level, and the signal swb1bx, swa1bx, swa0bx are H level. Thus, the transmission gate 46g of the switch 44g is turned ON, and the transmission gates 46e, 46f, 46h of the switches 44e, 44f, 44h are turned OFF. Thus, the memory block B0 is made usable for Channel B, and the memory blocks A0, A1, B1 are made unusable for Channel B.

Thus, the CPU 14 can use the memory capacity of 96 Mbits, and the GPU 16 can use the memory capacity of 32 Mbits.

As described above, according to the present embodiment, the selectors 28a, 28b which selectively connect the respective plural bus lines 26 provided associated with the plural memory blocks A0, A1, B0, B1 to any one of the plural input/output ports 22a, 22b are provided. Thus, according to the present embodiment, the plural memory blocks A0, A1, B0, B1 can be connected respectively to desired Channel A, B, and the memory capacity of the semiconductor memory device 10 can be effectively used, which can lead to the cost reduction.

According to the present embodiment, the power source is not supplied to the memory blocks A0, A1, B0, B1 when they are not used, which can contribute to the power consumption reduction.

[b] Second Embodiment

Figure 15:
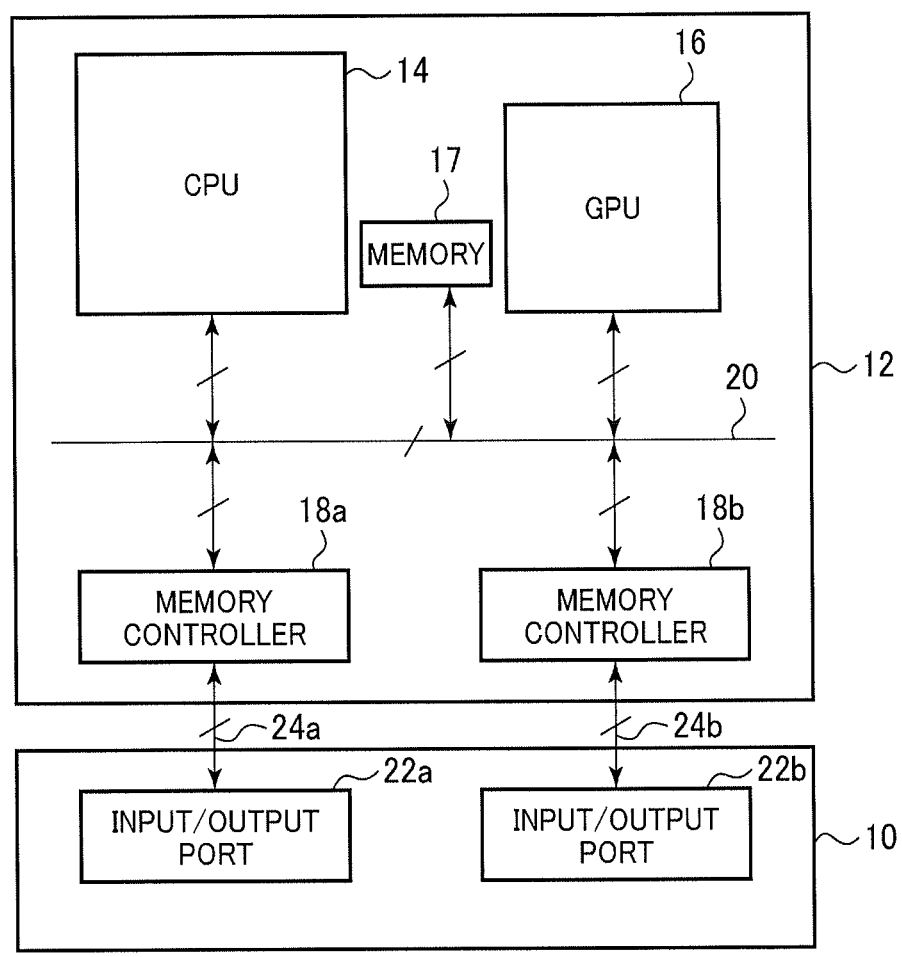
FIG. 15 is a block diagram of an electronic device according to a second embodiment.
Figure 16:
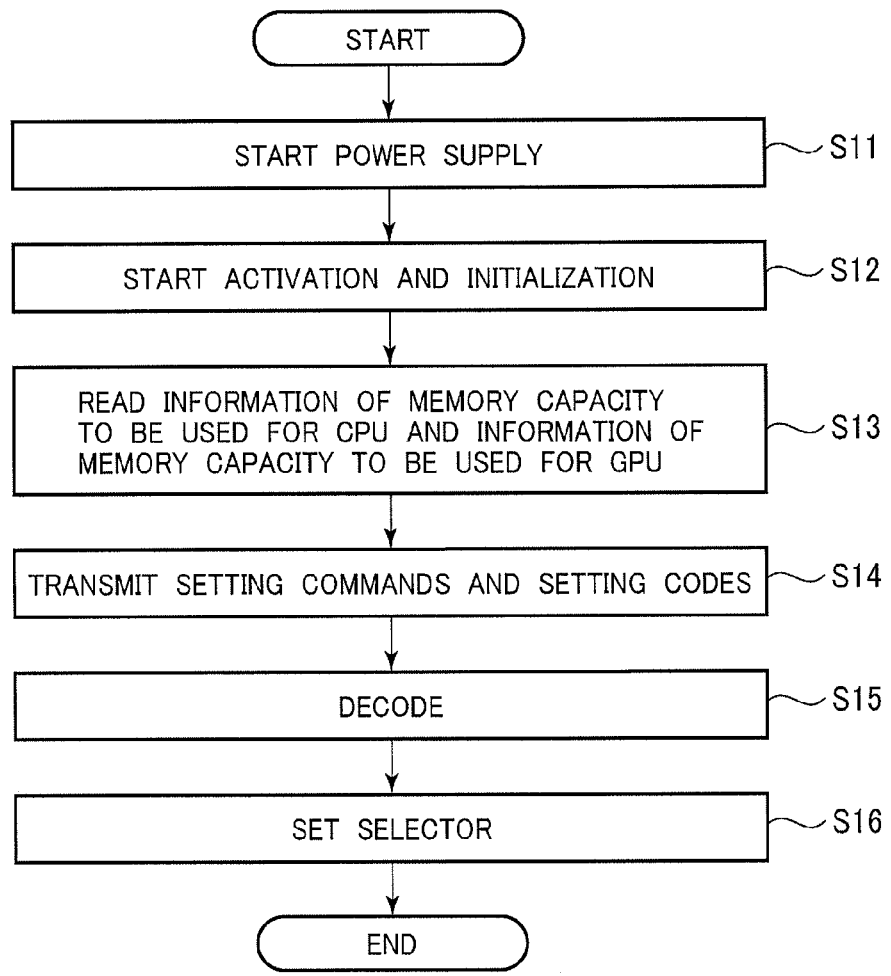
FIG. 16 is a flow chart of an operation of the electronic device according to the second embodiment.

The semiconductor memory device and the electronic device using the semiconductor memory device according to a second embodiment will be described with reference to FIGS. 15 and 16. FIG. 15 is the block diagram of the electronic device according to the present embodiment. FIG. 16 is the flow chart of the operation of the electronic device according to the present embodiment. The same constituent members of the present embodiment as those of the semiconductor memory device and the electronic device according to the first embodiment illustrated in FIGS. 1 to 14 are represented by the same reference numbers not to repeat or to simplify the description.

In the electronic device according to the present embodiment, the information of a memory capacity to be used for the CPU 14, and the information of a memory capacity to be used for the GPU 16 are stored in a memory 17 independent from the CPU 14 and the GPU 16.

As illustrated in FIG. 15, the memory 17 is provided independent from the CPU 14 and the GPU 16. The memory 17 is connected to the CPU 14, etc. via the bus line 20. The memory 17 is, e.g., a nonvolatile semiconductor memory device.

In the memory 17, the information of a memory capacity to be used by CPU 14 and the information of a memory capacity to be used by the GPU 16 are stored.

As described above, the electronic device according to the present embodiment is constituted.

Next, the operation of the electronic device according to the present embodiment will be described with reference to FIG. 16.

First, the power source is supplied to the electronic device according to the present embodiment (Step S11).

Next, upon the start of the supply of the power source to the electronic device, the SOC 12 starts to be activated while the semiconductor memory device 10 starts to be initialized (Step S12). The semiconductor memory device 10 initialized the internal circuit (not illustrated).

Next, the CPU 14 reads the information of a memory capacity to be used for the CPU 14 and the information of a memory capacity to be used for the GPU 16 (Step S13). The information of a memory capacity to be used for the CPU 14 and the information of a memory capacity to be used for the GPU 16 are stored in the memory 17 in advance. When the memory capacity to be used for the CPU 14 is 96 Mbits, and the memory capacity to be used for the GPU 16 is 32 Mbits, Setting A-III illustrated in FIG. 12, for example, is used for Channel A, and Setting B-I illustrated in FIG. 12, for example, is used for Channel B.

Next, the CPU 14 transmits signals P0-P2, Q0-Q2 indicating the setting codes together with setting commands for setting the setting units 38a, 38b to the input/output ports 22a, 22b via the memory controllers 18a, 18b (Step S14). When the setting for Channel A is, e.g., A-III (see FIG. 12), for example, the signals indicating the setting code are P0=0 (L level), P1=1 (H level), P2=0 (L level). When the setting for Channel B is, e.g., B-I (see FIG. 12), for example, the signals indicating the setting code is P0=0 (L level), P1=0 (L level), P2=0 (L level).

Then, the input ports 22a, 22b set ON the transmission gates 52a-52c, 74a-74c, and read the signals P0-P2, Q0-Q2 indicating the setting codes. Thus, the setting codes are latched in the setting unit 38a, 38b, and decoding is performed by the setting unit 38a, 38b (Step S15).

When the decoding is performed by the setting units 38a-38b, setting of the selectors 28a, 28b is performed by the setting units 38a, 38b (Step S16).

Specifically, signals swa0ax, swa0az, swa1ax, swa1az, swb0ax, swb0az, swb1ax, swb1az indicating the result of the decoding by the setting unit 38a are inputted from the setting unit 38a to the selector 28a. When the setting for Channel A is A-III, the signals swa0az, swa1az, swb1az are H level, and the signal swb1az is L level. The signals swa0ax, swa1ax, swb1ax are L level, and the signal swb0ax is H level. Thus, the transmission gate 46a, 46b, 46d of the switch 44a, 44b, 44d are turned ON, and the transmission gate 46c of the switch 44c is turned OFF. Thus, the memory blocks A0, A1, B1 are made usable for Channel A, and the memory block B0 is made unusable for Channel A.

Signals swa0bx, swa0bz, swa1bx, swa1bz, swb0bx, swb0bz, swb1bx, swb1bz indicating the result of the decoding by the setting unit 38b are inputted from the setting unit 38b to the selector 28b. When the setting for Channel B is B-I, the signal swb0bx is H level, the signals swb1bz, swa1bz, swa0bz are L level. Also, the signal swb0bx is L level, and the signals swb1bx, swa1bx, swa0bx are H level. Thus, the transmission gate 46g of the switch 44g is turned ON, and the transmission gates 46e, 46f, 46h of the switches 44e, 44f, 44h are turned OFF. Thus, the memory block B0 is made usable for Channel B, and the memory blocks A0, A1, B1 are made unusable for Channel B.

Thus, the CPU 14 can use the memory capacity of, e.g., 96 Mbits, and the GPU 16 can use the memory capacity of, e.g., 32 M bits.

As described above, the information of a memory capacity to be used for CPU 14 and the information of a memory capacity to be used by the GPU 16 may be stored in the independent memory 17.

[c] Third Embodiment

Figure 17:
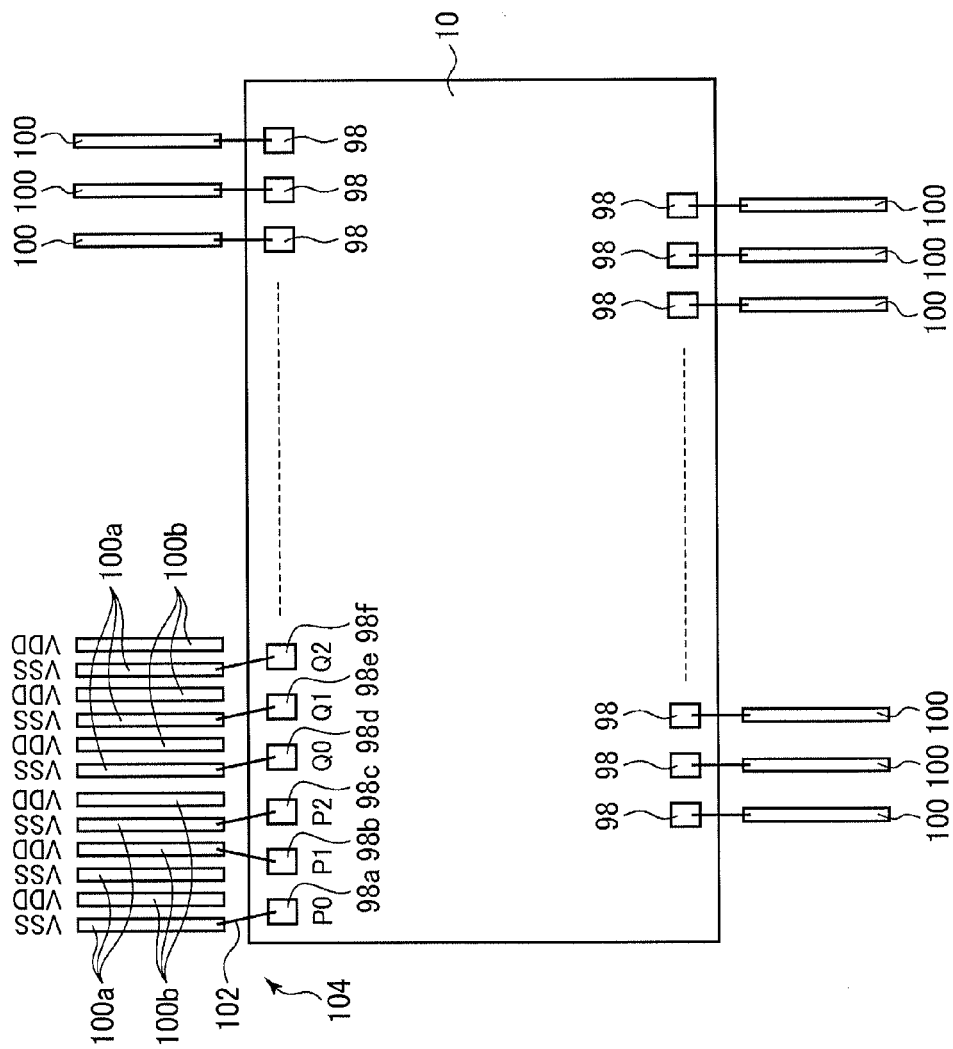
FIG. 17 is a plan view of an electronic device according to a third embodiment.
Figure 18:
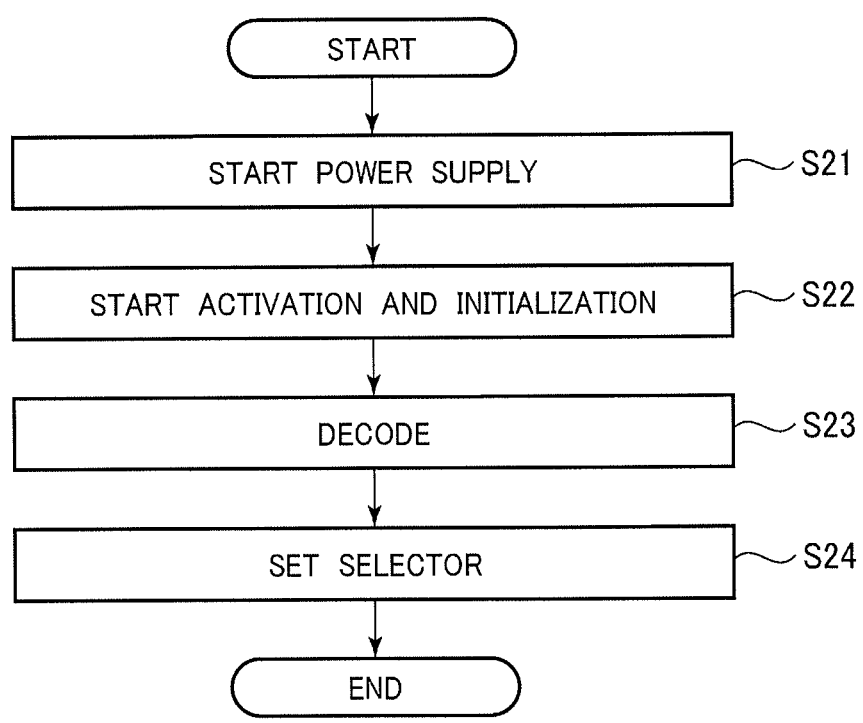
FIG. 18 is a flow chart of an operation of the electronic device according to the third embodiment.
Figure 19A:
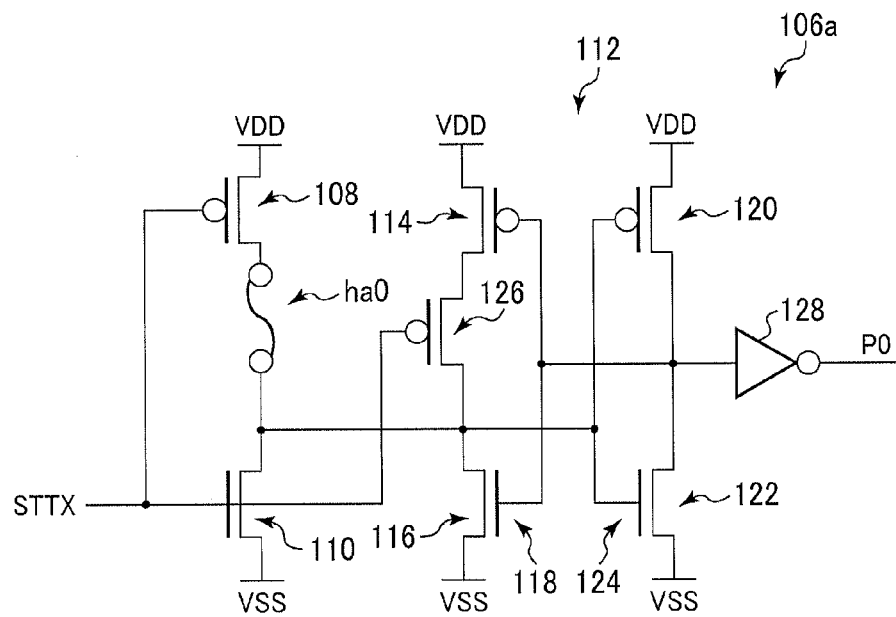
FIGS. 19A to 22 are circuit diagrams of a fuse setting circuit of a semiconductor memory device according to a fourth embodiment.
Figure 19B:
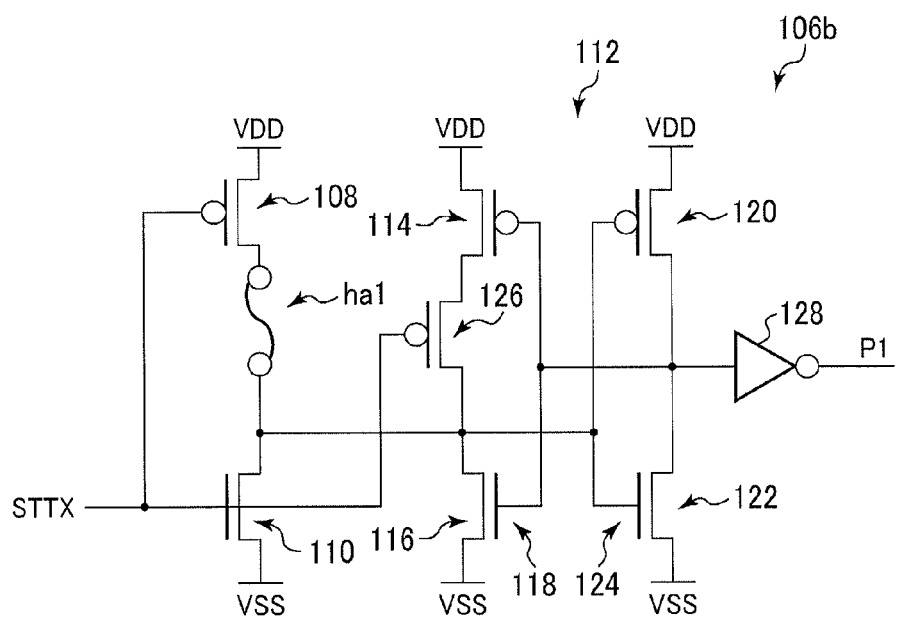
Figure 20:
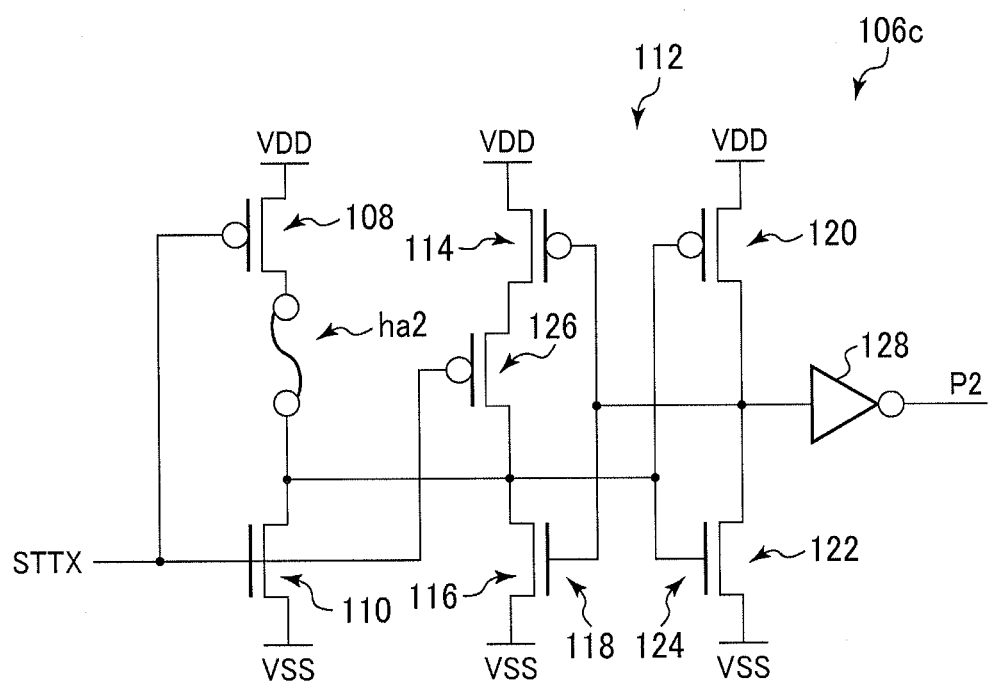
Figure 21A:
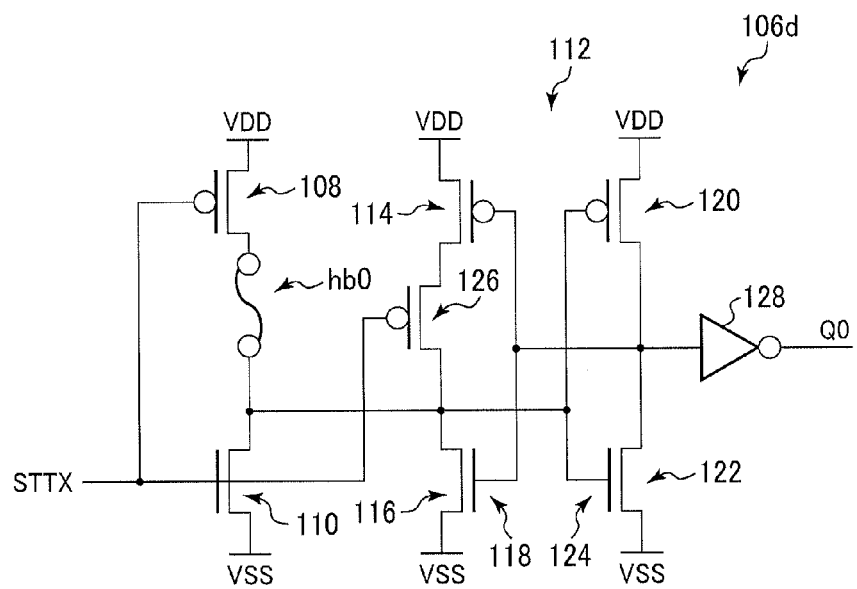
Figure 21B:
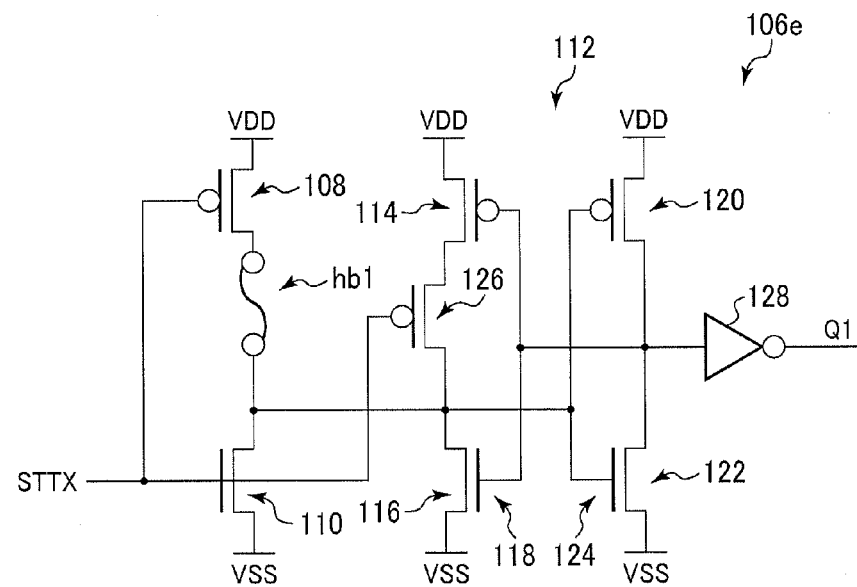
Figure 22:
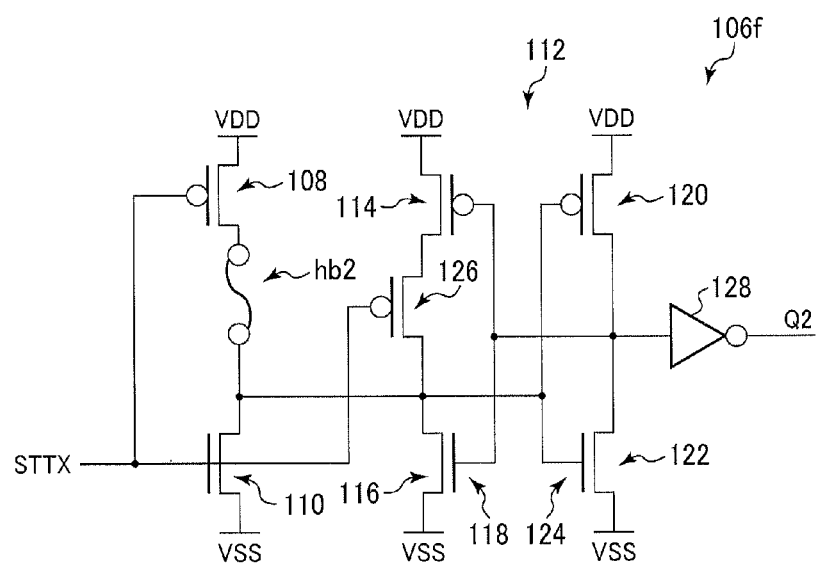

The semiconductor memory device and the electronic device using the semiconductor memory device according to a third embodiment will be described with reference to FIG. 17. FIG. 17 is a plan view of the electronic device according to the present embodiment. FIG. 18 is the flow chart of the operation of the electronic device according to the present embodiment. The same constituent members of the present embodiment as those of the semiconductor memory device and the electronic device according to the first and the second embodiments illustrated in FIGS. 1 to 16 are represented by the same reference numbers not to repeat or to simplify the description.

In the electronic device according to the present embodiment, the signals P0-P2, Q0-Q2 indicating the setting codes are sets by a bonding option 104.

As illustrated in FIG. 17, in the semiconductor memory device 10, pads (bonding option pads, electrode pads, bonding pads) 98a-98f for the setting by bonding option are formed. The pads 98a-98c are for setting respectively L level or H level the signals P0-P2 indicating the setting codes and are connected respectively to the input terminals of the transmission gates 52a-52c (see FIG. 7). The pads 98d-98f are for setting respectively L level or H level the signals Q0-Q2 indicating the setting codes and are connected respectively to the input terminals of the transmission gates 74a-74c.

In the semiconductor memory device 10, pads 98 for connecting signal lines (interconnections, electrode pads) 100 of the circuit board (not illustrated) the semiconductor memory device 10 is mounted on are formed.

In the circuit board the semiconductor memory device 10 is mounted on, electrodes (interconnections, electrode pads) 100a for setting the pads 98a-98f at a ground potential VSS (L level), electrodes 100b for setting the pads 98a-98f at a power supply potential VDD (H level) are formed. The potential of the electrodes 100a is set at the ground potential (GND). The potential of the electrodes 100b is set at the power supply potential VDD.

In the circuit board the semiconductor memory device 10 is mounted on, signal lines 100 for connecting to the pads 98 are formed.

The pads 98a-98f are connected suitably to the electrodes 100a, 100b by bonding wires (electric wires) 102.

As described above, in the present embodiment, the bonding option (bonding option circuit) 104 which can connect the pads 98a-98f at H level or L level via the bonding wires 102 is formed.

When the setting for Channel A is, e.g., A-III (see FIG. 12), the signal P0 is L level, the signal P1 is H level, and the signal P2 is L level. In this case, the pad 98a for setting the signal P0 is connected by the bonding wire 102 to the electrode 100a connected to the ground potential VSS. The pad 98b for setting the signal P1 is connected by the bonding wire 102 to the electrode 100b connected to the power supply potential VDD. The pad 98c for setting the signal P2 is connected by the bonding wire 102 to the electrode 100a connected to the ground potential VSS.

When the setting for Channel B is, e.g., B-I (see FIG. 12), the signal Q0 is L level, and the signal Q1 is L level, and the signal Q2 is L level. In this case, the pad 98d for setting the signal Q0 is connected by the bonding wire 102 to the electrode 100a connected to the ground potential VSS. The pad 98e for setting the signal Q1 is connected by the bonding wire 102 to the electrode 100a connected to the ground potential VSS. The pad 98f for setting the signal Q2 is connected by the bonding wire 102 to the electrode 100a connected to the ground potential VSS.

The pads 98 formed in the semiconductor memory device 102 are connected by the bonding wire 102 to the signal lines 100 formed in the circuit board.

Thus, the semiconductor memory device according to the present embodiment and the electronic device using the semiconductor memory device are constituted As described above, the signals P0-P2, Q0-Q2 indicating the setting codes may be set by the bonding option 104.

Then, the operation of the electronic device according to the present embodiment will be described with reference to FIG. 18. FIG. 18 is the flow chart of the operation of the electronic device according to the present embodiment.

First, the power source is supplied to the electronic device according to the present embodiment (Step S21).

Next, upon the start of the supply of the power source to the electronic device, the SOC 12 starts to be activated while the semiconductor memory device 10 starts to be initialized (Step S22). The semiconductor memory device 10 initializes the internal circuit (not illustrated).

Then, the transmission gates 52a-52c, 74a-74c are set ON, whereby the signal P0-P2, Q0-Q2 indicating the setting codes are read. As described above, the signals P0-P2, Q0-Q2 indicating the setting codes are set by the bonding option 104. When Setting A-III illustrated in FIG. 12, for example, is set for Channel A, the signal P0 is L level, the signal P1 is H level, and the signal P2 is L level. When Setting B-I illustrated in FIG. 12, for example, is set for Channel B, the signal Q0 is L level, the signal Q1 is L level, and the signal Q2 is L level. Thus, the setting codes are latched in the setting units 38a, 38b, and decoding is performed by the setting unit 38a, 38b (Step S23).

When the decoding by the setting units 38a, 38b is performed, setting of the selectors 28a, 28b is performed by the setting units 38a, 38b (Step S24).

Specifically, signals swa0ax, swa0az, swa1ax, swa1az, swb0ax, swb0az, swb1ax, swb1az indicating the result of the decoding by the setting unit 38a are inputted from the setting unit 38a to the selector 28a. When the setting for Channel A is A-III, the signals swa0az, swa1az, swb1az are H level, and the signal swb0az is L level. Also, the signals swa0ax, swa1ax, swb1ax are L level, and the signal swb0ax is H level. Thus, the transmission gates 46a, 46b, 46d of the switches 44a, 44b, 44d are turned ON, and the transmission gate 46c of the switch 44c is turned OFF. Thus, the memory blocks A0, A1, B1 are made usable for channel A, and the memory block B0 is made unusable for Channel A.

The signals swa0bx, swa0bz, swa1bx, swa1bz, swb0bx, swb0bz, swb1bx, swb1bz indicating the result of the decoding by the setting unit 38b are inputted from the setting unit 38b to the selector 28b. When the setting for Channel B is B-I, the signal swb0bz is H level, and the signals swb1bz, swa1bz, swa0bz are L level. The signal swb0bx is L level, and the signals swb1bx, swa1bx, swa0bx are H level. Thus, the transmission gate 46g of the switch 44g is turned ON, and the transmission gates 46e, 46f, 46h of the switches 44e, 44f, 44h are turned OFF. Thus, the memory block B0 is made usable for Channel B, and the memory blocks A0, A1, B1 are made unusable for Channel B.

Thus, the CPU 14 can use the memory capacity of 96 Mbits, and the GPU 16 can use the memory capacity of 32 Mbits.

Thus, the signals P0-P2, Q0-Q2 indicating the setting codes may be set by using the bonding option 104.

[d] Fourth Embodiment

The semiconductor memory device according to a fourth embodiment and the electronic device using the semiconductor memory device will be descried with reference to FIGS. 19A to 24. The same members of the present embodiment as those of the semiconductor memory device and the electronic device according to the first to the third embodiments illustrated in FIGS. 1 to 18 are represented by the same reference numbers not to repeat or to simplify the description.

In the semiconductor memory device according to the present embodiment, the signals P0-P2, Q0-Q2 indicating the setting codes are set by using the fuses ha0-ha2, hb0-hb2.

FIGS. 19A to 22 are circuit diagrams of the fuse setting circuit of the semiconductor memory device according to the present embodiment.

In the present embodiment, in the setting unit 38a (see FIG. 2) on the side of Channel A of the semiconductor memory device 10, fuse setting circuit 106a-106c including the fuses ha0-ha2 is formed.

In the setting unit 38b (see FIG. 2) on the side of Channel B of the semiconductor memory device 10, a fuse setting circuits 106d-106f including the fuses hb0-hb2 are formed.

The respective fuse setting circuits 106a-106f are formed as follows.

That is, a PMOS transistor 108 and an NMOS transistor 110 are serially connected to each other via each of the fuses ha0-ha2, hb0-hb2. The PMOS transistors 108 have the sources connected to the power supply potential VDD. The PMOS transistors 108 have the drains connected respectively to one terminals of the fuses ha0-ha2, hb0-hb2. The fuses ha0-ha2, hb0-hb2 have the other terminals connected to the drains of the NMOS transistors 110. The NMOS transistors 110 have the source connected to the ground potential VSS.

In the respective setting circuits 106a-106f, latch circuits 112 are provided. Each latch circuit 112 includes a CMOS inverter 118 including a PMOS transistor 114 and an NMOS transistor 116, and a CMOS inverter 124 including a PMOS transistor 120 and an NMOS transistor 122. A PMOS transistor 126 is provided between the PMOS transistor 114 and the NMOS transistor 116.

The PMOS transistor 114 has the source connected to the power supply potential VDD. The PMOS transistor 114 has the drain connected to the source of the PMOS transistor 126. The PMSO transistor 126 has the drain connected to the drain of the NMOS transistor 116. The NMOS transistor 116 has the source connected to the ground potential VSS. The PMOS transistor 120 has the source connected to the power supply potential VDD. The PMOS transistor 120 has the drain connected to the drain of the NMOS transistor 122. The NMOS transistor 122 has the source connected to the ground potential VSS. A starter line STTX is connected to the gate of the PMOS transistor 108, the gate of the NMOS transistor 110 and the gate of the PMOS transistor 126.

The fuses ha0-ha2, hb0-hb2 have the other terminals connected to the drains of the NMOS transistors 116, the gates of the PMOS transistors 120 and the gates of the NMOS transistors 122.

The drain of the NMOS transistor 122 and the drain of the PMOS transistor 120 are connected to the gate of the PMOS transistor 114 and the gate of the NMOS transistor 116. The drain of the NMOS transistor 122 and the drain of the PMOS transistor 120 are connected to the output signal line of the latch circuit 112.

The output signals of the latch circuit 112 are inversed respectively by the inverters 128 to be the signals P0-P2, Q0-Q2 indicating the setting codes.

Figure 23:
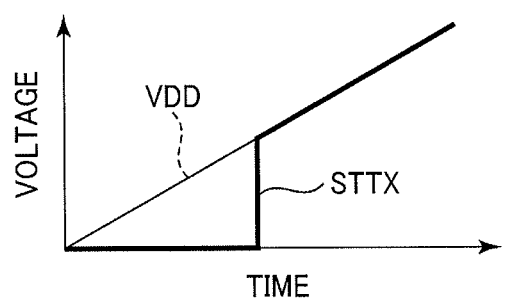
FIG. 23 is a time chart illustrating a starter signal STTX.

FIG. 23 is the time chart of the starter signal STTX. In FIG. 23, a period of time from the state of the supply of power source is taken on the horizontal axis, and on the vertical axis, the voltage is taken. In FIG. 23, the thick solid line indicates the starter signal STTX, and the thin solid line indicates the power supply voltage VDD.

When the supply of the power source to the electronic device is started, the power supply voltage VDD gradually rises.

The starter signal STTX is L level when the power supply voltage VDD is a prescribed voltage value or below after the supply of the power source to the electronic device is started. Such starter signal STTX is generated by a starter signal generation circuit not illustrated.

The starter signal STTX has the voltage equal to the power supply voltage VDD after a prescribed period of time has passed.

The starter signal STTX is L level for a prescribed period of time after the supply of the power source to the electronic device has started, whereby the information of the fuses ha0-ha3, hb0-hb3 are retained in the latch circuits 112.

When the fuses ha0-ha3, hb0-hb3 are cut, the signals P0-P2, Q0-Q2 indicating the setting codes are respectively L level.

When the fuses ha0-ha3, hb0-hb3 are not cut and are kept connected, the signals P0-P2, Q0-Q2 indicating the setting codes are respectively H level.

FIG. 24 is the setting tables of the semiconductor memory device according to the present embodiment.

For Setting A-I, i.e., when the memory block A0 alone is used for Channel A, all the fuses ha0, ha1, ha2 are cut. Thus, the signal P0 is L level, the signal P1 is L level, and the signal P2 is L level. Thus, the memory block A0 is made usable for Channel A, and the memory blocks A1, B0, B1 are made unusable for Channel A.

The fuses ha0-ha3, hb0-hb3 can be cut by, e.g., laser beam irradiation or others.

For Setting A-II, i.e., when the memory blocks A0, A1 are used for Channel A, the fuse ha0 is not cut, and the fuses ha1, ha2 are cut. Thus, the signal P0 is H level, the signal P1 is L level, and the signal P2 is L level. Thus, the memory blocks A0, A1 are made usable for Channel A, and the memory blocks B0, B1 are made unusable for Channel A.

For Setting A-III, i.e., when the memory blocks A0, A1, B1 are used for Channel A, the fuse ha0 is cut, the fuse ha1 is not cut, and the fuse ha2 is cut. Thus, the signal P0 is L level, the signal P1 is H level, and the signal P2 is L level. Thus, the memory blocks A0, A1, B1 are made usable for Channel A, and the memory block B0 is made unusable for Channel A.

For Setting A-IV, i.e., when the memory blocks A0, A1, B0, B1 are used for Channel A, the fuses ha0, ha1 are not cut, and the fuse ha2 is cut. Thus, the signal P0 is H level, the signal P1 is H level, and the signal P2 is L level. Thus, the memory blocks A0, A1, B0, B1 are made usable for Channel A.

For Setting B-I, i.e., when the memory block B0 alone is used for Channel B, all the fuses hb0, hb1, hb2 are cut. Thus, the signal Q0 is L level, the signal Q1 is L level, and the signal Q2 is L level. Thus, the memory block B0 is made usable for Channel B, and the memory blocks A0, A1, B1 are made unusable for Channel B.

For Setting B-II, i.e., when the memory block B0 and the memory block B1 are used for Channel B, the fuse hb0 is not cut, and the fuses hb1, hb2 are cut. Thus, the signal Q0 is H level, the signal Q1 is L level, and the signal Q2 is L level. Thus, the memory blocks B0, B1 are made usable for Channel B, and the memory blocks A0, A1 are made unusable for Channel B.

For Setting B-III, i.e., when the memory blocks B0, the memory block B1 and the memory block A1 are used for Channel B, the fuse hb0 is cut, the fuse hb1 is not cut, and the fuse hb2 is cut. Thus, the signal Q0 is L level, the signal Q1 is H level, and the signal Q2 is L level. Thus, the memory blocks B0, B1, A1 are made usable for Channel B, and the memory block A0 is made unusable for Channel B.

For Setting B-IV, i.e., when the memory block B0, the memory block B1, the memory block A0 and the memory block A1 are used for Channel B, the fuses hb0, hb1 are not cut, and the fuse hb2 is cut. Thus, the signal Q0 is H level, the signal Q1 is H level, and the signal Q2 is L level. Thus, the memory blocks B0, B1, A0, A1 are made usable for Channel B.

As described above, the signals P0-P2, Q0-Q2 indicating the setting codes may be set by using the fuses ha0-ha2, hb0-hb2.

Next, the operation of the electronic device according to the present embodiment will be described with reference to FIG. 18.

First, the power source is supplied to the electronic device according to the present embodiment (Step S21).

When the supply of the power source to the electronic device is started, the SOC12 starts to be activated while the semiconductor memory device 10 starts to be initialized (Step S22).

The semiconductor memory device 10 initializes the internal circuit (not illustrated).

The starter signal STTX is set L level for a prescribed period of time after the supply of the power source to the electronic device has started. The starter signal STTX is L level for a prescribed period of time after the supply of the power source to the electronic device has started, whereby fuses ha0-ha3, hb0-hb3 is retained respectively by the latch circuits 112.

When the fuses ha0-ha3, hb0-hb3 are cut, the signals P0-P2, Q0-Q2 indicating the setting codes are respectively L level.

When the fuses ha0-ha3, hb0-hb3 have not been cut and are kept connected, the signals P0-P2, Q0-Q2 indicating the setting codes are respectively H level.

Next, the transmission gates 52a-52c, 74a-74c are set ON, whereby the signals P0-P2, Q0-Q2 indicating the setting codes are read. As described above, the signals P0-P2, Q0-Q2 indicating the setting codes are set by using the fuses ha0-ha2, hb0-hb2. For example, when Setting A-III illustrated in FIG. 24 is set for Channel A, i.e., the fuse ha0 is cut, the fuse ha1 is not cut, and the fuse h1 is cut, i.e., the signal P0 is L level, the signal P1 is H level, and the signal P2 is L level. For example, when Setting B-I of FIG. 24 is set for Channel B, i.e., all of the fuses hb0-hb2 are cut, the signal Q0 is L level, the signal Q1 is L level, and the signal Q2 is L level. Thus, the setting codes are latched in the setting units 38a, 38b and the decoding is performed by the setting units 38a, 38b (Step S23).

When the decoding is performed by the setting units 38a, 38b, setting of the selectors 28a, 28b is performed by the setting units 38a, 38b (Step S24).

Specifically, the signals swa0ax, swa0az, swa1ax, swa1az, swb0ax, swb0az, swb1ax, swb1az are inputted from the setting unit 38a to the selector 28a. When Setting A-III is set for Channel A, the signal swa0az, swa1az, swb1az are H level, and the signal swb0az is L level. The signals swa0ax, swa1ax, swb1ax are L level, and the signal swb0ax is H level. Thus, the transmission gates 46a, 46b, 46d of the switches 44a, 44b, 44d are turned ON, and the transmission gate 46c of the switch 44c is turned OFF. Thus, the memory blocks A0, A1, B1 are made usable for Channel A, and the memory block B0 is made unusable for Channel A.

The signals swa0bx, swa0bz, swa1bx, swa1bz, swb0bx, swb0bz, swb1bx, swb1bz indicating the result of the decoding of the setting unit 38a are inputted from the setting unit 38b to the selector 28b. When Setting B-I is set for Channel B, the signal swb0bz is H level, and the signals swb1bz, swa1bz, swa0bz are L level. The signal swb0bx is L level, and the signals swb1bx, swa1bx, swa0bx are H level. Thus, the transmission gate 46g of the switch 44g is turned ON, and the transmission gates 46e, 46f, 46h of the switches 44e, 44f, 44h are turned OFF. Thus, the memory block B0 is made usable for Channel B, and the memory blocks A0, A1, B1 are made unusable for Channel B.

Thus, the CPU 14 can use the memory capacity of 96 Mbits, and the GPU 16 can use the memory capacity of 32 Mbits.

As described above, the signals P0-P2, Q0-Q2 indicating the setting codes may be set by the fuse setting circuits 106a-106f including the fuses ha0-ha2, hb0-hb2.

MODIFIED EMBODIMENTS

The present invention is not limited to the above-described embodiments and can cover other various modifications.

For example, the above-described embodiments have been described by means of the example that the number of the channel is two, but the channel number is not limited to two. The present invention is widely applicable to cases including a plural number of channels. For example, the number of the channels may be four.

The above-described embodiments have been described by means of the example that the settings are Setting A-I-A-IV, B-I-B-IV. The setting is not limited to them, and various setting are possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device comprising:
   a plurality of memory blocks;
   a plurality of bus lines, the plurality of bus lines being respectively associated with the plurality of memory blocks;
   a plurality of input/output ports;
   a plurality of selectors and a plurality of registers associated with the plurality of input/output ports, wherein each selector of the plurality of selectors is configured to selectively connect each of the plurality of bus lines to one of the plurality of input/output ports; and
   a plurality of setting units corresponding to the plurality of selectors, wherein each setting unit of the plurality of setting units is configured to include a register and set a connection of the respective selector based on setting information retained in the register, and the setting information retained in the register is transmitted to the register via the input/output port associated with the register.

2. A semiconductor memory device according to claim 1, wherein:
   the register comprises a mode register, and
   the setting information is transmitted corresponding to a setting command.

3. A semiconductor memory device comprising:
   a plurality of memory blocks;
   a plurality of bus lines, the plurality of bus lines being respectively associated with the plurality of memory blocks;
   a plurality of input/output ports;
   a selector configured to selectively connect each of the plurality of bus lines to one of the plurality of input/output ports; and
   a setting unit configured to set a connection of the selector, wherein the setting unit is configured to set the connection of the selector based on setting information set by a bonding option.

4. A semiconductor memory device comprising:
   a plurality of memory blocks;
   a plurality of bus lines, the plurality of bus lines being respectively associated with the plurality of memory blocks;
   a plurality of input/output ports;
   a selector configured to selectively connect each of the plurality of bus lines to one of the plurality of input/output ports;
   a setting unit configured to set a connection of the selector; and
   a power supply control unit configured to shut the supply of the power source to the memory blocks connected to none of the plurality of input/output ports.

5. A semiconductor memory device according to claim 1, wherein:

the plurality of input/output ports each is configured to include an input buffer, an output buffer, an address decoder and a command decoder, and the plurality of bus lines each is configured to include a data bus line, an address bus line and a command bus line.

6. An electronic device comprising:

a semiconductor memory device including:
- a plurality of memory blocks,
- a plurality of bus lines being respectively associated with the plurality of memory blocks,
- a plurality of input/output ports,
- a plurality of selectors and a plurality of registers associated with the plurality of input/output ports, wherein each selector of the plurality of selectors is configured to selectively connect each of the plurality of bus lines to one of the plurality of input/output ports, and
- a plurality of setting units corresponding to the plurality of selectors, wherein each setting unit of the plurality of setting units is configured to include a register and set a connection of the respective selector based on setting information retained in the register, and the setting information retained in the register is transmitted to the register via the input/output port associated with the register; and a plurality of processing units, each of the plurality of selectors being configured to be set in such a way that the memory block that is accessed from one of the plurality of processing unit, and the memory block that is accessed from the other of the plurality of processing units are different from each other.

* * * * *